(12) United States Patent
Sadamitsu et al.

(10) Patent No.: US 7,700,394 B2
(45) Date of Patent: Apr. 20, 2010

(54) METHOD FOR MANUFACTURING SILICON WAFER METHOD

(75) Inventors: Shinsuke Sadamitsu, Tokyo (JP); Wataru Sugimura, Tokyo (JP); Masanori Akatsuka, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 216 days.

(21) Appl. No.: 11/631,451

(22) PCT Filed: Jun. 21, 2005

(86) PCT No.: PCT/JP2005/011337

§ 371 (c)(1),
(2), (4) Date: Aug. 14, 2007

(87) PCT Pub. No.: WO2006/003812

PCT Pub. Date: Jan. 12, 2006

(65) Prior Publication Data

US 2008/0118424 A1    May 22, 2008

(30) Foreign Application Priority Data

Jun. 30, 2004    (JP) .............................. 2004-192367

(51) Int. Cl.
*G01R 31/26* (2006.01)
*H01L 31/00* (2006.01)

(52) U.S. Cl. .......................... 438/45; 423/348; 423/349; 423/324; 438/14; 438/402; 438/530

(58) Field of Classification Search ................. 423/324, 423/325, 348, 349; 438/22, 45, 400, 402, 438/510, 514, 530; 257/E21.321; 117/2, 117/3

See application file for complete search history.

(56) References Cited

U.S. PATENT DOCUMENTS

| | | | | |
|---|---|---|---|---|
| 6,129,787 | A * | 10/2000 | Adachi et al. .................. | 117/89 |
| 6,222,252 | B1 * | 4/2001 | Numano et al. ............. | 257/617 |
| 6,387,466 | B1 * | 5/2002 | Fusegawa et al. .......... | 428/64.1 |
| 2002/0142170 | A1 * | 10/2002 | Asayama et al. ............ | 428/446 |

FOREIGN PATENT DOCUMENTS

JP    9-190954    7/1997

(Continued)

OTHER PUBLICATIONS

Sueoka, Koji, et al., "Effect of Oxide Precipitate Sizes on the Mechanical Strength of Czochralski Silicon Wafers", *Jpn. J. Appl. Phys.* 1997; 36:7095-7099.

*Primary Examiner*—Timothy C Vanoy
*Assistant Examiner*—Richard M Rump
(74) *Attorney, Agent, or Firm*—Greenblum & Bernstein, P.L.C.

(57) ABSTRACT

There is obtained a silicon wafer which has a large diameter, where no slip generated therein in a wide range of a density of oxygen precipitates even though a heat treatment such as SLA or FLA is applied thereto, and which has high strength.

First, by inputting as input parameters combinations of a plurality of types of oxygen concentrations and thermal histories set for manufacture of a silicon wafer, a Fokker-Planck equation is solved to calculate each of a diagonal length L and a density D of oxygen precipitates in the wafer after a heat treatment step to form the oxygen precipitates (11) and immediately before a heat treatment step of a device manufacturing process is calculated. Then, a maximum heat stress S acting in a tangent line direction of an outer peripheral portion of the wafer in the heat treatment step of the device manufacturing process is calculated based on a heat treatment furnace structure and a heat treatment temperature used in the heat treatment step of the device manufacturing process, and then an oxygen concentration or the like satisfying the following Expression (1) is determined:

$$12000 \times D^{-0.26} \leq L \leq 51000 \times S^{-1.55} \qquad (1).$$

8 Claims, 4 Drawing Sheets

FOREIGN PATENT DOCUMENTS

| | | |
|---|---|---|
| JP | 10-150048 | 6/1998 |
| JP | 10-303208 | 11/1998 |
| JP | 2002-299345 | 10/2002 |
| JP | 2003-318181 | 11/2003 |
| WO | WO 03/003441 A1 | 1/2003 |

* cited by examiner

METHOD FOR MANUFACTURING SILICON WAFER METHOD

TECHNICAL FIELD

The present invention relates to a method for manufacturing a silicon wafer in which oxygen precipitates are formed and no slip occurs, and a silicon wafer manufactured by this method.

BACKGROUND ART

A wafer cut out from a silicon single crystal obtained by a Czochralski method (which will be referred to as a CZ method hereinafter) has been conventionally used in order to manufacture a semiconductor device. In a device manufacturing process, a wafer undergoes various heat treatments and a slip may be produced in the wafer in some cases, but a regular batch type heat treatment furnace is used in a conventional process and a diameter of a wafer which is as small as 200 mm is primarily used, and hence occurrence of the slip is not a very serious problem.

However, in a state-of-the-art device manufacturing process in recent years, a single-wafer processing type heat treatment method such as SLA (Spike Lamp Anneal) or FLA (Flash Lamp Anneal) is used as a heat treatment which activates an ion-implanted impurity, and a distribution of the impurity in a depth direction is controlled in a narrow range, and hence there is carried out a heat treatment method which increases a temperature to a predetermined value at a very high speed and performs rapid cooling from this temperature. Therefore, a heat stress acting on the wafer becomes larger than that in the conventional process. On the other hand, a primary diameter of a wafer is shifting to a larger diameter like 300 mm, and a stress caused by a tare weight or a heat stress in a heat treatment also becomes larger when a wafer diameter is increased. Therefore, in the state-of-the-art process using a wafer having a diameter of 300 mm, a slip is apt to occur easily than ever, and deformation of the wafer also becomes considerable, leading to a reduction in a yield ratio of a device.

On the other hand, it is disclosed a semiconductor substrate which contains oxygen in the range of $5 \times 10^{17}$ to $10 \times 10^{17}$ atoms/cm$^3$ and contains polyhedral (eight-faceted to 14-faceted) oxygen precipitates with a density in the range of $10^8$ to $10^{10}$ pieces/cm$^3$ in the region of 10 mm or below from a substrate outer periphery (see, e.g., Patent Document 1). In this semiconductor substrate, since the polyhedral oxygen precipitates contained with a density of $10^8$ to $10^{10}$ pieces/cm$^3$ inhibit movement of a dislocation which serves as a slip, occurrence of the slip from the outer peripheral portion of the substrate can be constrained at the time of a heat treatment in LSI manufacture.

Patent Document 1: Japanese Patent Application Laid-open No. 190954-1997 (claim 1, paragraph [0015])

SUMMARY OF THE INVENTION

In the conventional semiconductor substrate disclosed in Patent Document 1, the density of oxygen precipitates in the range of which no slip is generated is defined, but a size of each oxygen precipitate is not defined at all.

On the other hand, in the semiconductor substrate disclosed in Patent Document 1, when the density of oxygen precipitates is less than $10^8$ pieces/cm$^3$, an effect of inhibition of a dislocation motion cannot be sufficiently effected, and the density of oxygen precipitates cannot be set to $10^{10}$ pieces/cm$^3$ or above because only oxygen precipitates corresponding to an over saturated amount of an oxygen concentration can precipitate and, for this reason, the range of the density of oxygen precipitates in the range of which no slip is generated is limited to $10^8$ to $10^{10}$ pieces/cm$^3$, and there is an inconvenience that occurrence of a slip cannot be inhibited with respect to a silicon wafer having oxygen precipitates with a density which is out of this range.

It is an object of the present invention to provide a method manufacturing for a silicon wafer with high strength in which a slip is not produced in a wide range of an oxygen precipitate density even if a diameter is increased and a rapid heating and rapid cooling heat treatment such as SLA or FLA is applied, and to provide a silicon wafer manufactured by this method.

It is another object of the present invention to provide a method for manufacturing a silicon wafer by which a wafer in which no slip is produced in a device manufacturing process can be designed even if an experiment with time and labor to check a slip occurrence situation is not conducted in a device manufacturing process, and to provide a silicon wafer manufactured by this method.

When the present inventors have prepared a plurality of silicon wafers having different diagonal lengths (sizes) and densities of oxygen precipitates to check a slip occurrence behavior in a high-temperature heat treatment for these wafers, they have revealed that a slip is hardly produced if the diagonal length (the size) and the density of the oxygen precipitates have a predetermined relationship and that a slip having the oxygen precipitate itself as a starting point does not occur if a maximum heat stress acting in a tangent line direction of a wafer outer peripheral portion in a device process heat treatment and the diagonal length (the size) of the oxygen precipitate satisfy a predetermined relationship, resulting in achievement of the invention defined in claim 1 according to the present application.

As shown in FIGS. 1 and 2, the invention according to claim 1 is an improvement in a method for manufacturing a silicon wafer where a heat treatment is applied to a silicon wafer 10 manufactured by slicing a silicon single-crystal rod to form each oxygen precipitate 11 in the wafer 10.

A characteristic configuration thereof lies in that the wafer 10 having each oxygen precipitate 11 formed therein is a silicon wafer which is then subjected to a heat treatment in a semiconductor device manufacturing process and the method comprises: a step of setting a plurality of types of oxygen concentrations and thermal histories which are used to manufacture the wafer 10; a step of solving a Fokker-Planck equation by inputting as input parameters respective combinations of the plurality of types of oxygen concentrations and the thermal histories to calculate each of a diagonal length L (mm) and a density D (pieces/cm$^3$) of the oxygen precipitate 11 in the wafer 10 after the heat treatment step of forming the oxygen precipitates 11 and immediately before the heat treatment step of the device manufacturing process; a step of calculating a maximum heat stress S (MPa) acting in a tangent line direction of an outer peripheral portion of the wafer 10 in the heat treatment step of the device manufacturing process based on a structure and a heat treatment temperature of a heat treatment furnace used in the heat treatment step of the device manufacturing process; and a step of determining an oxygen concentration and a thermal history satisfying a relationship of the following Expression (1) in the plurality of types of oxygen concentrations and thermal histories:

$$12000 \times D^{-0.26} \leq L \leq 51000 \times S^{-1.55} \quad (1)$$

In this manufacturing method of a silicon wafer described in claim 1, the oxygen precipitate 11 having the diagonal length (the size) and the density satisfying $L \geqq 12000 \times D^{-0.26}$ in Expression (1) can inhibit extension of a slip in a high-temperature heat treatment of the wafer 10. Further, when the oxygen precipitate 11 having the diagonal length L (the size) and the density D in the range defined by Expression (1) is produced in the wafer 10, a slip which is generated from the outer peripheral portion of the wafer 10 can be inhibited based on a heat stress in the heat treatment step of the device manufacturing process, and a dislocation which occurs from the oxygen precipitate 11 itself can be also avoided. Since the wafer 10 in which no slip is produced in the device manufacturing process can be designed even if an experiment with time and labor to check a slip occurrence situation is not conducted in the device manufacturing, manufacturing conditions of the wafer 10 in which no slip occurs in the device manufacturing process can be determined in a short time at a low cost. Here, the "slip" means a crystal defect which is produced due to slipping in a crystal when a silicon wafer is subjected to a heat treatment and a stress such as a heat stress is applied along a given crystal surface.

A plurality of, i.e., one or more types of dopant concentrations selected from a group consisting of B, P, As and Sb in the wafer may be further set, and these dopant concentrations may be respectively added to the input parameters.

Further, a plurality of types of carbon concentrations in the wafer may be further set, and these carbon concentrations may be respectively added to the input parameters.

Furthermore, a plurality of types of nitrogen concentrations in the wafer may be further set, and these nitrogen concentrations may be respectively added to the input parameters.

As shown in FIGS. 1 and 2, the invention described in claim 5 is a silicon wafer manufactured by the method described in one of claims 1 to 4.

In this silicon wafer described in claim 5, even if the range of the density of the oxygen precipitate 11 is extended, no slip is produced in the wafer 10, and strength of the silicon wafer 10 is high.

As described above, according to the present invention, first, by inputting as input parameters respective combinations of the plurality of types of oxygen concentrations and thermal histories which are set to manufacture the silicon wafer, the Fokker-Planck equation is solved to calculate each of the diagonal length L and the density D of the oxygen precipitates in the wafer after the heat treatment step of forming the oxygen precipitates and immediately before the heat treatment step of the device manufacturing process, then the maximum heat treatment S acting in the tangent line direction of the outer peripheral portion of the wafer in the heat treatment step of the device manufacturing process is calculated based on the structure and the heat treatment temperature of the heat treatment furnace used in the heat treatment step of the device manufacturing process, the oxygen concentration and others satisfying the relationship of Expression (1) are subsequently determined, and hence, even if a diameter of the wafer is increased and a rapid heating and rapid cooling heat treatment such as SLA or FLA is applied, a wafer with high strength in which no slip is produced in a wide range of the oxygen precipitate density can be obtained, and occurrence of the slip in the device process heat treatment can be avoided, resulting in improvement of a yield ratio of a semiconductor device manufactured from this wafer.

Additionally, even if an experiment with time and labor to check a slip occurrence situation is not conducted in the device manufacturing process, a wafer in which no slip is produced in the device manufacturing process can be designed. As a result, manufacturing conditions of the wafer in which no slip is generated in the device manufacturing process can be determined in a short time at a low cost.

Further, in a wafer manufactured by the above-described method, even if the range of the oxygen precipitate density is extended, no slip is produced in the wafer, and the wafer has high strength.

EXPLANATION OF NUMERALS 10 silicon wafer
11, 21 and 31 oxygen precipitate

DETAILED DESCRIPTION OF THE INVENTION

First Embodiment

Figure 1:
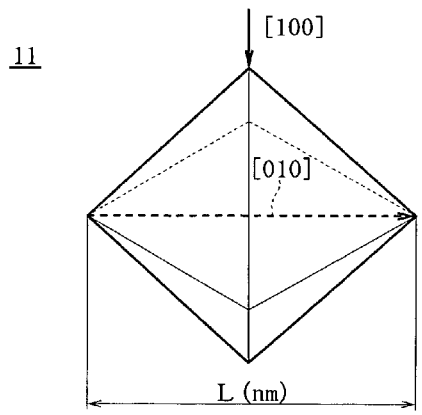
FIG. 1 is a schematic view of a regular octahedral oxygen precipitate formed in a silicon wafer according to a first embodiment of the present invention.
Figure 2:
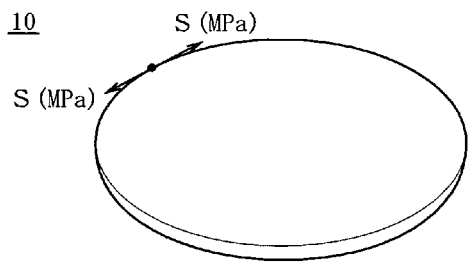
FIG. 2 is a perspective view of a silicon wafer having said oxygen precipitate.

As shown in FIGS. 1 and 2, a silicon wafer 10 is a silicon wafer obtained by slicing a silicon single-crystal rod grown based on the CZ method, to which a heat treatment is then applied to form oxygen precipitates 11 inside and of which at least a main surface is subjected to mirror polishing processing. This wafer 10 is then shipped to a semiconductor device manufacturer and subjected to a heat treatment in a device manufacturing process.

Figure 3:
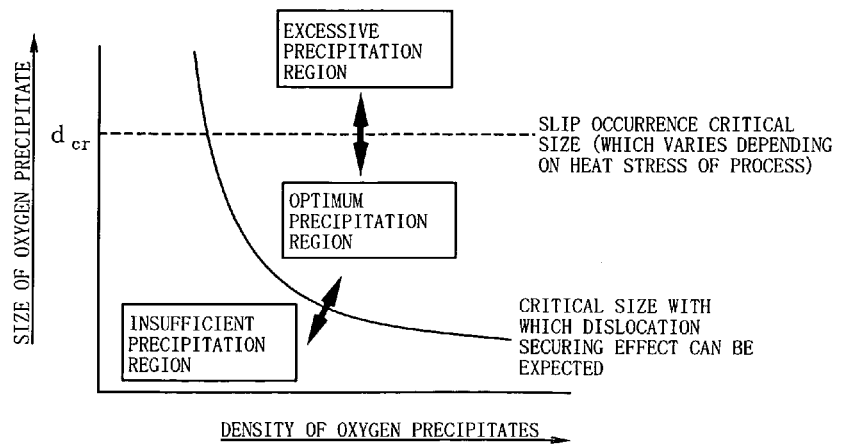
FIG. 3 is a schematic view showing a concept of a relationship between a density and a diagonal length (a size) of said oxygen precipitate.

On the other hand, FIG. 3 is a schematic view showing a concept of a relationship between a density and a diagonal length (a size) of oxygen precipitates formed in the wafer after the heat treatment step of forming the oxygen precipitates and immediately before the heat treatment step of the device manufacturing process, where there are lower limit values of the diagonal length (the size) and the density of the oxygen precipitates within which a dislocation in the wafer can be secured even if a heat stress functions in the heat treatment step of the device manufacturing process, and where there are upper limit values of the diagonal length (the size) and the density of the oxygen precipitates within which no slip is produced from the oxygen precipitates. Therefore, occurrence of a slip can be inhibited when the diagonal length (the size) and the density of the oxygen precipitates are in a region defined by the lower limit values and the upper limit values (a region between the lower limit values and the upper limit values).

A description will now be given as to a method of determining manufacturing conditions of the silicon wafer 10 (FIG. 2) which fix the dislocation and inhibit the slip.

First, a plurality of types of manufacturing conditions required to manufacture the wafer 10 are set. Here, the manufacturing conditions mean two or more types of conditions which are selected from a group consisting of an oxygen concentration, a thermal history, a dopant concentration, a carbon concentration and a nitrogen concentration and include at least the oxygen concentration and the thermal history. As a general thermal history, there are a thermal history in a wafer manufacturer and a thermal history in a device manufacturer. As the thermal history in the wafer manufacturer, there are a thermal history during a pulling-up operation of a silicon single-crystal rod and a thermal history obtained by a heat treatment to form the oxygen precipitates. Further, as the thermal history in the device manufacturer, there are a thermal history obtained by a high-temperature main device manufacturing process in which a slip is generated when the oxygen precipitates are not formed and a thermal history obtained by a relatively-low-temperature preliminary device manufacturing process which is carried out before the main device manufacturing process. The thermal history of the manufacturing conditions according to this example consists of a thermal history during a pulling-up operation of a silicon single-crystal rod, a thermal history obtained by a heat treatment required to form oxygen precipitates and a thermal history obtained by a relatively-low-temperature preliminary device manufacturing process. As the heat treatment required to form oxygen precipitates, there is, e.g., a ramping heat treatment (a heat treatment which increases a temperature at a fixed temperature-up speed from a low temperature) which is performed from a low temperature in the temperature range of 600 to 1000° C. in the high-resistance wafer 10 or a ramping heat treatment which is performed from a low temperature in the temperature range of 500 to 1000° C. after effecting a high-temperature heat treatment to form a buried oxide layer in the high-resistance SIMOX wafer 10. Furthermore, the dopant concentration is a concentration of one or more types of dopants selected from a group consisting of B, P, As and Sb.

By inputting as input parameters respective combinations of the manufacturing conditions such as a plurality of types of oxygen concentrations and thermal histories or the like a Fokker-Planck equation is solved ブランクto calculate each of a diagonal length L (nm) and a density D (pieces/cm³) of the oxygen precipitates 11 in the wafer 10 after the heat treatment step for formation of the oxygen precipitates 11 and immediately before the heat treatment step of the device manufacturing process. Here, the timing immediately before the heat treatment step of the device manufacturing process means the timing after the preliminary device manufacturing process and before the main device manufacturing process. A behavior of each oxygen precipitate 11 in the wafer 10 is represented by using a size distribution function f(r,t) having a radius r of the oxygen precipitate and a heat treatment time t as functions, and a change in f(r,t) with time is obtained by solving the following Fokker-Planck equation (2), thereby calculating the diagonal length L (nm) and the density D (pieces/cm³) of the oxygen precipitate 11. In Expression (2), J(r,t) is represented by the following Expression (3).

[Numerical Expression 1]

$$\frac{\partial}{\partial t} f(r, t) = -\frac{\partial}{\partial r} J(r, t) \tag{2}$$

$$J = -B(r, t)\frac{\partial f}{\partial r} + A(r, t)f(r, t) \tag{3}$$

In Expression (3), A(r,t) and B(r,t) satisfy a relationship of the following Expression (4).

[Numerical Expression 2]

$$B(r, t) = \frac{-kT}{\frac{\partial}{\partial r}\Delta G(r, t)} A(r, t) \tag{4}$$

In Expression (4), k is a Boltzmann constant, T is an absolute temperature, ΔG(r,t) is an amount of a free energy change of Gibbs involved by formation of the oxygen precipitate 11 having the radium r. Moreover, when the size distribution function f(r,t) after an arbitrary heat treatment is assigned to the following Expressions (5) and (6), the diagonal length L (nm) and the density D (pieces/cm³) of the oxygen precipitate 11 (a regular octahedral oxygen precipitate) can be calculated.

[Numerical Expression 3]

$$D(\text{pieces/cm}^3) = \int f(r, t) dr \tag{5}$$

$$L(\text{nm}) = 3 \times 10^7 \times \frac{\int rf(r, t)dr}{\int f(r, t)dr} \tag{6}$$

$$= 3 \times 10^7 \times \frac{\int rf(r, t)dr}{D}$$

Subsequently, a maximum heat stress S (MPa) acting in a tangent line direction of an outer peripheral portion of the wafer 10 in the heat treatment step of the device manufacturing process is calculated based on a structure and a heat treatment temperature of a heat treatment furnace used in the heat treatment step of the device manufacturing process based on a simulation using a computer.

Of the manufacturing conditions such as a plurality of types of oxygen concentrations and thermal histories or the like, manufacturing conditions such as an oxygen concentration and a thermal history or the like which satisfy a relationship of the following Expression (1) are determined.

$$12000 \times D^{-0.26} \leq L \leq 51000 \times S^{-1.55} \tag{1}$$

It is to be noted that, in this first embodiment, the diagonal length (the size) of the oxygen precipitate 11 means a diagonal length extending in a crystal orientation direction [010] of the regular octahedral oxygen precipitate 11 when this oxygen precipitate 11 is seen from a crystal orientation direction

[100] of the silicon wafer 10 (FIG. 1). Additionally, Expression (1) is obtained by conducting an experiment as explained in a later-described example. In the case, it is preferable to measure the diagonal length (the size) and the density of the oxygen precipitate by performing selective etching to a wafer surface with a Wright etchant and effecting observation using an optical microscope, and further to check the size based on observation using a transmission electron microscope.

Based on the above description, the wafer 10 in which no slip is produced in the device manufacturing process can be designed even if an experiment with time and labor to check a slip occurrence situation is not conducted in the device manufacturing process. As a result, it is possible to determine manufacturing conditions of the wafer 10 under which no slip is generated in the device manufacturing process in a short time at a low cost.

Specifically, the manufacturing conditions such as an oxygen concentration and a thermal history or the like of the wafer 10 are determined so as to form in the wafer 10 each oxygen precipitate 11 having the diagonal length L (the size) and the density D in the range defined by Expression (1). That is, when the manufacturing conditions such as an oxygen concentration and a thermal history or the like of the wafer 10 are determined so as to form in the wafer 10 each oxygen precipitate 11 having the diagonal length L (the size) and the density D in the range defined by Expression (1), a dislocation can be fixed by the oxygen precipitate 11 in the wafer 10, a slip can be inhibited, a slip generated from the outer peripheral portion of the wafer 10 based on a heat stress in the heat treatment step of the device manufacturing process can be constrained, and a dislocation which occurs from the oxygen precipitate 11 itself can be also avoided.

It is to be noted that the oxygen concentration in the wafer 10 is set to fall within the range of $10 \times 10^{17}$ to $18 \times 10^{17}$ atoms/cm$^3$ (ASTM F-121, 1979 same as above hereinafter) or preferably $11 \times 10^{17}$ to $15 \times 10^{17}$ atoms/cm$^3$. Here, the oxygen concentration in the wafer 10 is limited to the range of $10 \times 10^{17}$ to $18 \times 10^{17}$ atoms/cm$^3$ because the wafer strength is deteriorated (lowered) when the oxygen concentration is less than $10 \times 10^{17}$ atoms/cm$^3$ and perfectibility of a wafer surface is deteriorated (reduced) when the oxygen concentration exceeds $18 \times 10^{17}$ atoms/cm$^3$.

Further, in the ramping heat treatment applied to the high-resistance silicon wafer 10, it is preferable for the ramping rate to be 0.5 to 2.0° C./minute when a temperature is increased from 700° C. to 1000° C. After this ramping heat treatment, a pre-heat treatment where the silicon wafer is held at 1000° C. for 0 to four hours is carried out. More oxygen precipitates 11 separate out and a resistance value of the silicon wafer 10 can be stabilized by this pre-heat treatment.

Furthermore, in the ramping heat treatment applied to the high-resistance SIMOX wafer 10, it is preferable for a ramping the to be 0.3 to 2.0° C./minute when a temperature is increased from 550° C. to 700° C. After this ramping heat treatment, a first heat treatment where the silicon wafer is held at 700° C. for one to four hours is performed, and a second heat treatment where the same is held at 1000 to 1100° C., or preferably 1000 to 1050° C. for four to 16 hours, or preferably eight to 16 hours is effected. Each oxygen precipitate nucleus is formed by the first heat treatment, and each oxygen precipitate is grown by the second heat treatment.

Moreover, in case of performing a high-temperature heat treatment in a non-oxidizing atmosphere such as an argon atmosphere or a hydrogen atmosphere within the range of 1100 to 1250° C., the silicon wafer 10 which has many oxygen precipitate nuclei and in which the oxygen precipitates 11 can readily grow is used. In such a silicon wafer 10, COPs (Crystal Originated Particles) or the oxygen precipitates 11 do not exist in a surface layer portion of the wafer 10, a slip can be secured in a bulk, no slip is produced from each oxygen precipitate 11 itself, and a sufficient IG (Intrinsic Gettering) effect can be also expected.

Additionally, the dopant concentration in the silicon wafer 10 is set to the range of $1 \times 10^{12}$ to $1 \times 10^{21}$ atoms/cm$^3$, or preferably the range of $1 \times 10^{13}$ to $1 \times 10^{20}$ atoms/cm$^3$. The dopant concentration of, e.g., B or P in the silicon wafer 10 is limited to the range of $1 \times 10^{12}$ to $1 \times 10^{21}$ atoms/cm$^3$ because the dopant concentration cannot be controlled when it is less than $1 \times 10^{12}$ atoms/cm$^3$ and because if the silicon wafer 10 is an epitaxial wafer a misfit dislocation occurs when the dopant concentration exceeds $1 \times 10^{21}$ atoms/cm$^3$.

Further, the carbon concentration in the silicon wafer 10 is set to the range of $1 \times 10^{15}$ to $1 \times 10^{18}$ atoms/cm$^3$, or preferably $5 \times 10^{15}$ to $5 \times 10^{17}$ atoms/cm$^3$. The carbon concentration in the silicon wafer 10 is limited to the range of $1 \times 10^{15}$ to $1 \times 10^{18}$ atoms/cm$^3$ because the intrinsic gettering effect is poor when the carbon concentration is less than $1 \times 10^{15}$ atoms/cm$^3$ and precipitation excess of oxygen precipitate nuclei occurs and excessive oxygen precipitates are generated during a predetermined heat treatment when the carbon concentration exceeds $1 \times 10^{18}$ atoms/cm$^3$.

Furthermore, the nitrogen concentration in the silicon wafer 10 is set to the range of $1 \times 10^{12}$ to $1 \times 10^{17}$ atoms/cm$^3$, or preferably $5 \times 10^{12}$ to $5 \times 10^{16}$ atoms/cm$^3$. Here, the nitrogen concentration in the silicon wafer 10 is limited to the range of $1 \times 10^{12}$ to $1 \times 10^{17}$/cm$^3$ because atomic vacancies in the silicon wafer 10 are apt to disappear when the nitrogen concentration is less than $1 \times 10^{12}$ atoms/cm$^3$ and because an amount of generated donors concerning nitrogen is increased to greatly change the resistivity of the silicon wafer 10 when the nitrogen concentration exceeds $1 \times 10^{17}$ atoms/cm$^3$.

It is to be noted that, when the silicon wafer is a P/P$^-$ type epitaxial wafer having a P-type epitaxial film is grown on a P$^-$-type support wafer, an optimum combination is that an oxygen concentration of the support wafer is set to $10 \times 10^{17}$ to $15 \times 10^{17}$ atoms/cm$^3$ or preferably $12 \times 10^{17}$ atoms/cm$^3$ a nitrogen concentration is set to $5 \times 10^{12}$ to $5 \times 10^{14}$ atoms/cm$^3$ or preferably $2 \times 10^{13}$ atoms/cm$^3$ and a dopant concentration of B is set to $2 \times 10^{14}$ to $2 \times 10^{16}$ atoms/cm$^3$ or preferably $1 \times 10^{15}$ atoms/cm$^3$.

Moreover, when the silicon wafer is a wafer subjected to annealing processing in an argon atmosphere, an optimum combination is that an oxygen concentration is set to $10 \times 10^{17}$ to $15 \times 10^{17}$ atoms/cm$^3$ or preferably $12 \times 10^{17}$ atoms/cm$^3$, a nitrogen concentration is set to $5 \times 10^{13}$ to $5 \times 10^{16}$ atoms/cm$^3$ or preferably $2 \times 10^{14}$ atoms/cm$^3$, a dopant concentration of B is set to $2 \times 10^{14}$ to $2 \times 10^{16}$ atoms/cm$^3$ or preferably $1 \times 10^{15}$ atoms/cm$^3$, a temperature-up speed in the range of 1000° C. to 1200° C. is set to 0.5 to 5° C./minute or preferably 1° C./minute, and a heat treatment where the wafer is held at 1150 to 1250° C. or preferably 1200° C. for 0.5 to two hours or preferably one hour is carried out.

Second Embodiment

Figure 4:
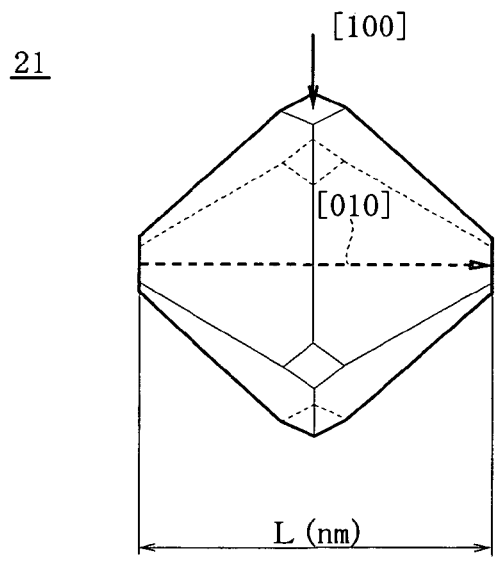
FIG. 4 is a schematic view of a 14-faceted oxygen precipitate formed in a silicon wafer according to a second embodiment of the present invention.

FIG. 4 shows a second embodiment according to the present invention.

In this example, a shape of an oxygen precipitate 21 formed in a silicon wafer is a 14-faceted shape. This 14-faceted oxygen precipitate 21 has a shape obtained by chamfering six corners of the regular octahedron oxygen precipitate in the first embodiment. The regular octahedron oxygen precipitate in the first embodiment and the 14-faceted oxygen precipitate 21 in this embodiment are generically called a polyhedral oxygen precipitate. Other structures are formed to be equal to those in the first embodiment. Moreover, in this example, a diagonal length (a size) of the oxygen precipitate 21 means a diagonal length extending in a crystal orientation direction [010] of the 14-faceted oxygen precipitate 21 when this oxygen precipitate 21 is seen from a crystal orientation direction [100] of a silicon wafer.

Third Embodiment

Figure 5:
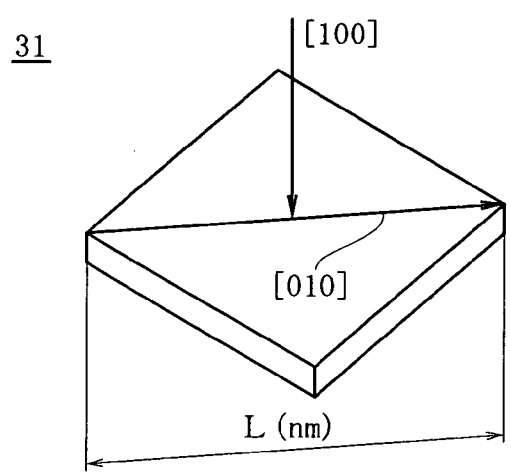
FIG. 5 is a schematic view of a square tabular oxygen precipitate formed in a silicon wafer according to a third embodiment of the present invention.

FIG. 5 shows a third embodiment according to the present invention.

In this embodiment, a shape of an oxygen precipitate 31 formed in a silicon wafer is a square tabular shape.

Additionally, assigning a size distribution function f(r,t) after an arbitrary heat treatment to Expression (5) mentioned above and the following Expression (7) can calculate a diagonal length L (nm) and a density (pieces/cm$^3$) of an oxygen precipitate 11 (a square tabular oxygen precipitate).

[Numerical Expression 4]

$$L(\text{nm}) = 10^7 \times \left[\frac{8}{\beta}\right]^{1/3} \frac{\int rf(r,t)dr}{\int f(r,t)dr} \quad (7)$$

$$= 10^7 \times \left[\frac{8}{\beta}\right]^{1/3} \frac{\int rf(r,t)dr}{D}$$

In Expression (7), β is an aspect ratio (a thickness/a diagonal length of the square tabular oxygen precipitate) of the oxygen precipitate (the square tabular oxygen precipitate) and it is a value of approximately 0.01. Other structures are formed to be equal to those in the first embodiment. Additionally, in this embodiment, the diagonal length (the size) of the oxygen precipitate 31 means a diagonal length extending in a crystal orientation direction [010] of the square tabular oxygen precipitate when this oxygen precipitate 31 is seen from a crystal orientation direction [100] of a silicon wafer.

EXAMPLES

Examples and comparative examples according to the present invention will now be described in detail.

Example 1

There was first prepared a silicon single crystal having a diameter of 200 mm, an oxygen concentration of $12 \times 10^{17}$ atoms/cm$^3$ and wherein nitrogen was doped so as to have a concentration of $3 \times 10^{14}$/cm$^3$. Then, this silicon single crystal was sliced to produce a silicon wafer, and this silicon wafer was subjected to argon annealing where the silicon wafer is held in an argon atmosphere at 1200° C. for one hour. Here, in a process of increasing a temperature to 1200° C., this process was carried out at a temperature-up speed of 1° C./minute in the range of 1000° C. to 1200° C. A density D of regular octahedral oxygen precipitates in this silicon wafer was $1 \times 10^{10}$ pieces/cm$^3$, and a size L of the oxygen precipitate (a diagonal length extending in a direction [010] of the regular octahedral oxygen precipitate when this oxygen precipitate is seen from a direction [100]) was 100 nm. This silicon wafer is referred to as Example 1.

Example 2

There was first prepared a silicon single crystal having a diameter of 200 mm, an oxygen concentration of $12 \times 10^{17}$ atoms/cm$^3$ and wherein nitrogen was doped so as to have a concentration of $3 \times 10^{14}$/cm$^3$. Then, this silicon single crystal was sliced to produce a silicon wafer, and this silicon wafer was subjected to argon annealing where the silicon wafer is held in an argon atmosphere at 1200° C. for one hour. Here, in a process of increasing a temperature to 1200°, this process was carried out at a temperature-up speed of 1° C./minute in the range of 1000° C. to 1200° C. A density D of regular octahedral oxygen precipitates in this silicon wafer was $1 \times 10^{10}$ pieces/cm$^3$, and a size L of the oxygen precipitate (a diagonal length extending in a direction [010] of the regular octahedral oxygen precipitate when this oxygen precipitate is seen from a direction [100]) was 50 nm. This silicon wafer is referred to as Example 2. Incidentally, it can be considered that the size of the oxygen precipitate is 50 nm which is smaller than that of Example 1 because a pulling-up operation was performed by using a single-crystal pulling-up furnace whose structure is different from a single-crystal pulling-up furnace of Example 1 and hence a thermal history in crystal growth varies.

Example 3

There was first prepared a silicon single crystal which has a diameter of 200 nm and an oxygen concentration of $12 \times 10^{17}$ atoms/cm$^3$ and in which nitrogen is not doped. Here, nitrogen was not doped in order to reduce a size of an oxygen precipitate in a silicon wafer after argon annealing to below that of Example 2. Then, this silicon single crystal was sliced to produce a silicon wafer, and this silicon wafer was subjected to argon annealing where the silicon wafer is held in an argon atmosphere at 1200° C. for one hour. Here, in a process of increasing a temperature to 1200° C., this process was carried out at a temperature-up speed of 1° C./minute in the range of 1000° C. to 1200° C. A density D of the regular octahedral oxygen precipitates in this silicon wafer was $1 \times 10^{10}$ pieces/cm$^3$, and a size L of the oxygen precipitate (a diagonal length extending in a direction [010] of the regular octahedral oxygen precipitate when this oxygen precipitate is seen from a direction [100]) was 30 nm. This silicon wafer is referred to as Example 3. It is to be noted that the same single crystal pulling-up furnace as that of Example 2 was used.

Example 4

A silicon wafer was manufactured in the same manner as that of Example 1 except that a temperature increasing process of argon annealing was carried out at a temperature-up speed of 2° C./minute in the range of 1000° C. to 1200° C. Here, the temperature increasing process was performed at the temperature-up speed of 2° C./minute in the range of 1000° C. to 1200° C. in order to vary a density of oxygen precipitates in the silicon wafer after argon annealing from that of Example 1. A density D of regular octahedral oxygen precipitates in this silicon wafer was $1 \times 10^9$ pieces/cm$^3$, and a size L of the oxygen precipitate (a diagonal length extending in a direction [010] of the regular octahedral oxygen precipitate when this oxygen precipitate is seen from a direction [100]) was 100 nm. This silicon wafer is referred to as Example 4.

Example 5

A silicon wafer was manufactured like Example 2 except that a temperature increasing process of argon annealing was carried out at a temperature-up speed of 2° C./minute in the range of 1000° C. to 1200° C. Here, the temperature increasing process was performed at the temperature-up speed of 2° C./minute in the range of 1000° C. to 1200° C. in order to reduce a density of oxygen precipitates in the silicon wafer after argon annealing to below that of Example 2. A density D of regular octahedral oxygen precipitates in this silicon wafer was $1 \times 10^9$ pieces/cm$^3$, and a size L of the oxygen precipitate (a diagonal length extending in a direction [010] of the regular octahedral oxygen precipitate when the oxygen precipitate is seen from a direction [100]) was 50 nm. This silicon wafer is referred to as Example 5.

Example 6

A silicon wafer was manufactured like Example 1 except that a temperature increasing process of argon annealing was carried out at a temperature-up speed of 3° C./minute in the range of 1000° C. to 1200° C. Here, the temperature increasing process was performed at the temperature-up speed of 3° C./minute in the range of 1000° C. to 1200° C. in order to reduce a density of oxygen precipitates in the silicon wafer after argon annealing to below that of Example 4. A density D of regular octahedral oxygen precipitates in this silicon wafer was $1 \times 10^8$ pieces/cm$^3$ and a size L of the oxygen precipitate (a diagonal length extending in a direction [010] of the rectangular octahedral oxygen precipitate when this oxygen precipitate is seen from a direction [100]) was 100 nm. This silicon wafer is referred to as Example 6.

Example 7

First, there was prepared a silicon single crystal having a diameter of 200 mm and an oxygen concentration of $15.5 \times 10^{17}$ atoms/cm$^3$. Subsequently, this silicon single crystal was sliced to produce a silicon wafer, an oxygen ions were implanted into this silicon wafer, and then a high-temperature heat treatment was performed to form a buried oxide layer, thereby manufacturing an SIMOX wafer. In order to form oxygen precipitate nuclei in this wafer and to grow oxygen precipitates, the wafer was first held in a nitrogen atmosphere at 700° C. for one hour to effect an oxygen precipitate nucleus formation heat treatment. Here, in the process of increasing a temperature to 700° C., a process in the range of 550 to 700° C. was performed at a temperature-up speed of 1° C./minute. Then, the wafer was held in a diluted oxygen atmosphere (a mixed gas atmosphere with oxygen and nitrogen mixed in the ration of 3% to 100%) at 1000° C. for 0.5 hour to carry out an oxygen precipitate nucleus formation heat treatment. As a result, each oxygen precipitate nucleus grew into a square tabular oxygen precipitate. A density D of the square tabular oxygen precipitates in this wafer was $1 \times 10^{10}$ pieces/cm$^3$. Moreover, a size L of this square tabular oxygen precipitate (a diagonal length extending in a direction of the square tabular oxygen precipitate when this oxygen precipitate is seen from a direction [100]) was 35 nm. This silicon wafer is referred to as Example 7.

Example 8

First, there was prepared a silicon single crystal having a diameter of 200 mm and an oxygen concentration of $15.5 \times 10^{17}$ atoms/cm$^3$. Subsequently, this silicon single crystal was sliced to produce a silicon wafer, an oxygen ions were implanted into this silicon wafer, and then a high-temperature heat treatment was performed to form a buried oxide layer, thereby manufacturing an SIMOX wafer. In order to form oxygen precipitate nuclei in this wafer and to grow oxygen precipitates, the wafer was first held in a nitrogen atmosphere at 700° C. for one hour to effect an oxygen precipitate nucleus formation heat treatment. Here, in a process of increasing a temperature to 700° C., this process was performed at a temperature-up speed of 2° C./minute in the range of 550 to 700° C. Then, the wafer was held in a diluted oxygen atmosphere (a mixed gas atmosphere with oxygen and nitrogen mixed in the ration of 3% to 100%) at 1000° C. for 1 hour to carry out an oxygen precipitate nucleus formation heat treatment. As a result, each oxygen precipitate nucleus grew into a square tabular oxygen precipitate. A density D of the square tabular oxygen precipitates in this wafer was $1 \times 10^9$ pieces/cm$^3$. Moreover, a size L of this square tabular oxygen precipitate (a diagonal length extending in a direction of the square tabular oxygen precipitate when this oxygen precipitate is seen from a direction [100]) was 60 nm. This silicon wafer is referred to as Example 8.

Example 9

First, there was prepared a silicon single crystal having a diameter of 200 mm and an oxygen concentration of $15.5 \times 10^{17}$ atoms/cm$^3$. Subsequently, this silicon single crystal was sliced to produce a silicon wafer, an oxygen ions were implanted into this silicon wafer, and then a high-temperature heat treatment was performed to form a buried oxide layer, thereby manufacturing an SIMOX wafer. In order to form oxygen precipitate nuclei in this wafer and to grow oxygen precipitates, the wafer was first held in a nitrogen atmosphere at 700° C. for one hour to effect an oxygen precipitate nucleus formation heat treatment. Here, in a process of increasing a temperature to 700° C., this process was performed at a temperature-up speed of 4° C./minute in the range of 550 to 700° C. Then, the wafer was held in a diluted oxygen atmosphere (a mixed gas atmosphere with oxygen and nitrogen mixed in the ration of 3% to 100%) at 1000° C. for 2.5 hours to carry out an oxygen precipitate nucleus formation heat treatment. As a result, each oxygen precipitate nucleus grew into a square tabular oxygen precipitate. A density D of the square tabular oxygen precipitates in this wafer was $1 \times 10^8$ pieces/cm$^3$. Moreover, a size L of this square tabular oxygen precipitate (a diagonal length extending in a direction of the square tabular oxygen precipitate when this oxygen precipitate is seen from a direction [100]) was 110 nm. This silicon wafer is referred to as Example 9.

Comparative Example 1

A silicon wafer was manufactured like Example 3 except that a temperature increasing process of argon annealing was performed at a temperature-up speed of 2° C./minute in the range of 1000° C. to 1200° C. Here, the temperature increasing process was carried out at the temperature-up speed of 2° C./minute in the range of 1000° to 1200° C. in order to reduce a density of oxygen precipitates in the silicon wafer after argon annealing to below that of Example 3. A density D of the regular octahedral oxygen precipitates in this silicon wafer was $1 \times 10^9$ pieces/cm$^3$, and a size L of the oxygen precipitate (a diagonal length extending in a direction [010] of the regular octahedral oxygen precipitate when this oxygen precipitate is seen from a direction [100]) was 30 nm. This silicon wafer is referred to as Comparative Example 1.

Comparative Example 2

A silicon wafer was manufactured like Example 2 except that a temperature increasing process of argon annealing was performed at a temperature-up speed of 3° C./minute in the range of 1000° C. to 1200° C. Here, the temperature increasing process was carried out at the temperature-up speed of 3° C./minute in the range of 1000° to 1200° C. in order to reduce a density of oxygen precipitates in the silicon wafer after argon annealing to below that of Example 5. A density D of the regular octahedral oxygen precipitates in this silicon wafer was $1\times10^8$ pieces/cm$^3$, and a size L of the oxygen precipitate (a diagonal length extending in a direction [010] of the regular octahedral oxygen precipitate when this oxygen precipitate is seen from a direction [100]) was 50 nm. This silicon wafer is referred to as Comparative Example 2.

Comparative Example 3

A silicon wafer was manufactured like Example 3 except that a temperature increasing process of argon annealing was performed at a temperature-up speed of 3° C./minute in the range of 1000° C. to 1200° C. Here, the temperature increasing process was carried out at the temperature-up speed of 3° C./minute in the range of 1000° to 1200° C. in order to reduce a density of oxygen precipitates in the silicon wafer after argon annealing to below that of Comparative Example 1. A density D of the regular octahedral oxygen precipitates in this silicon wafer was $1\times10^8$ pieces/cm$^3$, and a size L of the oxygen precipitate (a diagonal length extending in a direction [010] of the regular octahedral oxygen precipitate when this oxygen precipitate is seen from a direction [100]) was 30 nm. This silicon wafer was referred to as Comparative Example 3.

Comparative Example 4

First, there was prepared a silicon single crystal having a diameter of 200 mm and an oxygen concentration of $15.5\times10^{17}$ atoms/cm$^3$. Then, this silicon single crystal was sliced to produce a silicon wafer, an oxygen ions were implanted into this silicon wafer, and then a high-temperature heat treatment was carried out to form a buried oxide layer, thereby manufacturing an SIMOX wafer. In order form oxygen precipitate nuclei in this wafer and to grow oxygen precipitates, the wafer was first held in a nitrogen atmosphere at 700° C. for one hour to perform an oxygen precipitate nucleus formation heat treatment. Here, in the process of increasing a temperature to 700° C., a process in the range of 550 to 700° C. was carried out at a temperature-up speed of 2° C./minute the range. Then, the wafer was held in a diluted oxygen atmosphere (a mixed gas atmosphere with oxygen and nitrogen mixed in the ration of 3% to 100%) at 1000° C. for 0.6 hour to carry out an oxygen precipitate nucleus growth heat treatment. As a result, each oxygen precipitate nucleus grew into a square tabular oxygen precipitate. A density D of the square tabular oxygen precipitates in this wafer was $1\times10^9$ pieces/cm$^3$. Additionally, a size L of this square tabular oxygen precipitate (a diagonal length extending in a direction [010] of the square tabular oxygen precipitate when this oxygen precipitate is seen from a direction [100]) was 40 nm. This silicon wafer is referred to as Comparative Example 4.

Comparative Example 5

First, there was prepared a silicon single crystal having a diameter of 200 mm and an oxygen concentration of $15.5\times10^{17}$ atoms/cm$^3$. Then, this silicon single crystal was sliced to produce a silicon wafer, an oxygen ions were implanted into this silicon wafer, and then a high-temperature heat treatment was carried out to form a buried oxide layer, thereby manufacturing an SIMOX wafer. In order form oxygen precipitate nuclei in this wafer and to grow oxygen precipitates, the wafer was first held in a nitrogen atmosphere at 700° C. for one hour to perform an oxygen precipitate nucleus formation heat treatment. Here, in the process of increasing a temperature to 700° C., a process in the range of 550 to 700° C. was carried out at a temperature-up speed of 4° C./minute the range. Then, the wafer was held in a diluted oxygen atmosphere (a mixed gas atmosphere with oxygen and nitrogen mixed in the ration of 3% to 100%) at 1000° C. for two hours to carry out an oxygen precipitate nucleus growth heat treatment. As a result, each oxygen precipitate nucleus grew into a square tabular oxygen precipitate. A density D of the square tabular oxygen precipitates in this wafer was $1\times10^8$ pieces/cm$^3$. Additionally, a size L of this square tabular oxygen precipitate (a diagonal length extending in a direction of the square tabular oxygen precipitate when this oxygen precipitate is seen from a direction [100]) was 90 nm. This silicon wafer is referred to as Comparative Example 5.

<Comparative Test 1 and Evaluation>

Figure 6:
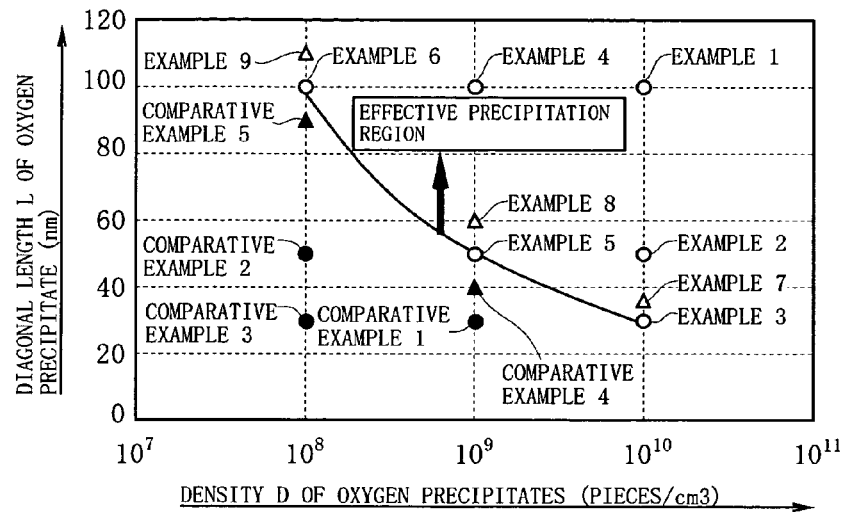
FIG. 6 is a view showing changes in diagonal lengths L of a regular octahedral oxygen precipitate and a square tabular oxygen precipitate in relation to changes in densities D of the regular octahedral oxygen precipitate and the square tabular oxygen precipitate in a silicon wafer when nitrogen is doped and as well as when not doped.

There was performed RTA processing which increases a temperature of each of the silicon wafers according to Examples 1 to 9 and Comparative Examples 1 to 5 to 1250° C. in a nitrogen atmosphere at a temperature-up speed of 100° C./second and then holds each of these wafers at this temperature for 30 seconds, and a slip generation behavior from an edge of each silicon wafer was evaluated by using XRT (X-ray Topograph). Table 1 and FIG. 6 show its result. It is to be noted that Table 1 shows an oxygen concentration, a nitrogen concentration, a temperature-up speed in the range of 550° C. to 700° C., a temperature-up speed in the range of 1000° C. to 1200° C., and a time of an added 1000° C. heat treatment. Further, in FIG. 6, a white circle and a black circle represent an example of a regular octahedral oxygen precipitate, and a white triangle and a black triangle represent an example of a square tabular oxygen precipitate. The white circle and the white triangle mean that no slip was produced, and the black circle and the black triangle mean that a slip was generated. Furthermore, in Table 1, the temperature-up speed in the range of 550° C. to 700° C. is determined as a first temperature-up speed; the temperature-up speed in the range of 1000° C. to 1200° C., a second temperature-up speed; and the time of the added 1000° C. heat treatment, an added heat treatment time.

TABLE 1

| | Oxygen concentration (atoms/cm$^3$) | Nitrogen concentration (atoms/cm$^3$) | 1st temperature-up speed (° C./min) | 2nd temperature-up speed (° C./min) | Added heat treatment time (hour) | Oxygen precipitate Shape | D (pieces/cm$^3$) | L (nm) | Presence/absence of occurrence of slip |
|---|---|---|---|---|---|---|---|---|---|
| Example 1 | $12\times10^{17}$ | $3\times10^{14}$ | — | 1 | — | Regular octahedron | $1\times10^{10}$ | 100 | Absence |
| Example 2 | $12\times10^{17}$ | $3\times10^{14}$ | — | 1 | — | Regular octahedron | $1\times10^{10}$ | 50 | Absence |

TABLE 1-continued

| | Oxygen concentration (atoms/cm³) | Nitrogen concentration (atoms/cm³) | 1st temperature-up speed (° C./min) | 2nd temperature-up speed (° C./min) | Added heat treatment time (hour) | Oxygen precipitate Shape | D (pieces/cm³) | L (nm) | Presence/absence of occurrence of slip |
|---|---|---|---|---|---|---|---|---|---|
| Example 3 | $12 \times 10^{17}$ | 0 | — | 1 | — | Regular octahedron | $1 \times 10^{10}$ | 30 | Absence |
| Example 4 | $12 \times 10^{17}$ | $3 \times 10^{14}$ | — | 2 | — | Regular octahedron | $1 \times 10^{9}$ | 100 | Absence |
| Example 5 | $12 \times 10^{17}$ | $3 \times 10^{14}$ | — | 2 | — | Regular octahedron | $1 \times 10^{9}$ | 50 | Absence |
| Example 6 | $12 \times 10^{17}$ | $3 \times 10^{14}$ | — | 3 | — | Regular octahedron | $1 \times 10^{8}$ | 100 | Absence |
| Example 7 | $15.5 \times 10^{17}$ | 0 | 1 | — | 0.5 | Square plate | $1 \times 10^{10}$ | 35 | Absence |
| Example 8 | $15.5 \times 10^{17}$ | 0 | 2 | — | 1 | Square plate | $1 \times 10^{9}$ | 60 | Absence |
| Example 9 | $15.5 \times 10^{17}$ | 0 | 4 | — | 2.5 | Square plate | $1 \times 10^{8}$ | 110 | Absence |
| Comparative Example 1 | $12 \times 10^{17}$ | 0 | — | 2 | — | Regular octahedron | $1 \times 10^{9}$ | 30 | Presence |
| Comparative Example 2 | $12 \times 10^{17}$ | $3 \times 10^{14}$ | — | 3 | — | Regular octahedron | $1 \times 10^{8}$ | 50 | Presence |
| Comparative Example 3 | $12 \times 10^{17}$ | 0 | — | 3 | — | Regular octahedron | $1 \times 10^{8}$ | 30 | Presence |
| Comparative Example 4 | $15.5 \times 10^{17}$ | 0 | 2 | — | 0.6 | Square plate | $1 \times 10^{9}$ | 40 | Presence |
| Comparative Example 5 | $15.5 \times 10^{17}$ | 0 | 4 | — | 2 | Square plate | $1 \times 10^{8}$ | 90 | Presence |

As apparent from Table 1 and FIG. 6, in a case where the density D of the oxygen precipitates in the silicon wafer is $1 \times 10^{1}$ pieces/cm³, no slip was produced when the size L of the regular octahedral oxygen precipitate is 100 nm, 50 nm or 30 nm (Examples 1 to 3), and no slip was likewise generated when the size L of the square tabular oxygen precipitate is 35 nm (Example 7). Furthermore, in a case where the density D of the oxygen precipitates in the silicon wafer is $1 \times 10^{9}$ pieces/cm³, no slip was produced when the size L of the regular octahedral oxygen precipitate is 100 nm or 50 nm (Examples 4 and 5), and no slip was likewise generated when the size L of the square tabular oxygen precipitate is 60 mm (Example 8), but a slip was generated when the size L of the regular octahedral oxygen precipitate is 30 nm (Comparative Example 1), and a slip was likewise produced when the size L of the square tabular oxygen precipitate is 40 nm (Comparative Example 4). Moreover, in a case where the density D of the oxygen precipitates in the silicon wafer is $1 \times 10^{8}$ pieces/cm³, no slip was generated when the size L of the regular octahedral oxygen precipitate is 100 nm (Example 6), and no slip was likewise produced when the size L of the square tabular oxygen precipitate is 110 nm (Example 9), but a slip was generated when the size L of the regular octahedral oxygen precipitate is 50 nm and 30 nm (Comparative Examples 2 and 3), and a slip was likewise produced when the size L of the square tabular oxygen precipitate is 90 nm (Comparative Example 5). Based on this result, it was possible to derive the following Relational Expression (A) which enables to obtain the size L (nm) of the oxygen precipitate required to avoid occurrence of a slip in relation to the density D (pieces/cm³) of the oxygen precipitates.

$$L \geq = 12000 \times D^{-0.26} \quad (A)$$

Additionally, based on the above description, it was revealed that a slip occurrence inhibiting effect can be determined in dependence upon the density D and the size (the diagonal length) L of the oxygen precipitate irrespective of a conformation of the oxygen precipitate.

Example 10

First, there was prepared a p-type silicon single crystal having a diameter of 150 mm and an oxygen concentration of $14 \times 10^{17}$ atoms/cm³. Then, this silicon single crystal was sliced to produce a silicon wafer, pre-heat treatment where this silicon wafer is held in a nitrogen atmosphere at 800° C. for eight hours was performed, and then a heat treatment where the same is held in the nitrogen atmosphere at 1100° C. for 0.12 hour was carried out. A density D of regular octahedral oxygen precipitates in this silicon wafer was $2 \times 10^{9}$ pieces/cm³, and a size L of the oxygen precipitate (a diagonal length extending in a direction [010] of the regular octahedral oxygen precipitate when this oxygen precipitate is seen from a direction [100]) was 70 nm. This silicon wafer was put into a transverse furnace having a nitrogen atmosphere at 1000° C. in an upright state at an input speed of 3 cm/minute, held in this furnace for 30 minutes, and then taken out from the furnace at a take-out speed of 3 cm/minute. At this time, a maximum heat stress acting in a tangent line direction of an outer peripheral portion of the silicon wafer was obtained by measuring a temperature in a wafer plane during the actual heat treatment and performing a calculation based on this measured value. Specifically, a temperature difference in the wafer plane was measured by putting a wafer in which thermocouples consisting of platinum/platinum-rhodium are buried at nine points (one point at a water central portion, five points at a wafer outer peripheral portion and three points between the wafer central portion and the wafer outer peripheral portion) as a sample into the furnace under the same conditions as those mentioned above and taking out this wafer. Further, a stress $\sigma_\theta$ in the tangent line direction at the wafer outer peripheral portion was obtained based on an expression $\sigma_\theta = (-\frac{1}{2}) \times \alpha \times E \times \Delta T$. Here, a is a linear expansion coefficient, E is a Young's modulus of silicon, $\Delta T$ is a value obtained by subtracting a temperature at the wafer central portion from a temperature at the wafer outer peripheral portion. A maximum heat stress S acting in the tangent line direction of the silicon wafer outer peripheral portion was 20 MPa. This silicon wafer was is referred to as Example 10.

Example 11

A heat treatment was applied to a silicon wafer like Example 10 except that a heat treatment where the silicon wafer is held in a nitrogen atmosphere at 1100° C. for 0.23 hour was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 200 nm, and a maximum heat stress S acting in a tangent line direction of a silicon wafer outer peripheral portion was 20 MPa. This silicon wafer is referred to as Example 11.

Example 12

A heat treatment was applied to a silicon wafer like Example 10 except that a heat treatment where the silicon wafer is held in a nitrogen atmosphere at 1100° C. for four hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 330 nm, and a maximum heat stress S acting in a tangent line direction of a silicon wafer outer peripheral portion was 20 MPa. This silicon wafer is referred to as Example 12.

Example 13

A heat treatment was applied to a silicon wafer like Example 10 except that a heat treatment where the silicon wafer is held in a nitrogen atmosphere at 1100° C. for eight hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 400 nm, and a maximum heat stress S acting in a tangent line direction of a silicon wafer outer peripheral portion was 20 MPa. This silicon wafer is referred to as Example 13.

Example 14

A heat treatment was applied to a silicon wafer like Example 10 except that a heat treatment where the silicon wafer is held in a nitrogen atmosphere at 1100° C. for 16 hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 490 nm, and a maximum heat stress S acting in a tangent line direction of a silicon wafer outer peripheral portion was 20 MPa. This silicon wafer is referred to as Example 14.

Example 15

First, there was prepared a p-type silicon wafer having a diameter of 150 mm and an oxygen concentration of $14 \times 10^{17}$ atoms/cm$^3$. Subsequently, a pre-heat treatment where this silicon wafer is held in a nitrogen atmosphere at 800° C. for eight hours was carried out, and then a heat treatment where the silicon wafer is held in the nitrogen atmosphere at 1100° C. for 0.12 hour was performed. A density D of regular octahedral oxygen precipitates in this silicon wafer was $2 \times 10^9$ pieces/cm$^3$, and a size L of the oxygen precipitate (a diagonal length extending in a direction [010] of the regular octahedral oxygen precipitate when this oxygen precipitate is seen from a direction [100]) was 70 nm. This silicon wafer was put into a transverse furnace having a nitrogen atmosphere at 1000° C. in an upright state at an input speed of 7 cm/minute, held in this furnace for 30 minutes and taken out from the furnace at a take-out speed of 7 cm/minute. At this time, a maximum heat stress S acting in a tangent line direction of a silicon wafer outer peripheral portion was obtained by measuring a temperature in a wafer plane during the actual heat treatment and performing a calculation based on this measured value, and this maximum heat stress S was 35 MPa. This silicon wafer is referred to as Example 15.

Example 16

A heat treatment was applied to a silicon wafer like Example 15 except that a heat treatment where the silicon wafer is held in a nitrogen atmosphere at 1100° C. for 0.23 hour was performed. A density D of regular octahedral oxygen precipitates in this silicon wafer was $2 \times 10^9$ pieces/cm$^3$, a size L of the oxygen precipitate (a diagonal length extending in a direction [010] when the regular octahedral oxygen precipitate is seen from a direction [100]) was 200 nm, and a maximum heat stress S acting in a tangent line direction of a silicon wafer outer peripheral portion was 35 MPa. This silicon wafer is referred to as Example 16.

Example 17

First, there was prepared a p-type silicon wafer having a diameter of 150 mm and an oxygen concentration of $14 \times 10^{17}$ atoms/cm$^3$. Subsequently, a pre-heat treatment where this silicon wafer is held in a nitrogen atmosphere at 800° C. for eight hours was carried out, and then a heat treatment where the silicon wafer is held in the nitrogen atmosphere at 1100° C. for 0.12 hour was performed. A density D of regular octahedral oxygen precipitates in this silicon wafer was $2 \times 10^9$ pieces/cm$^3$, and a size L of the oxygen precipitate (a diagonal length extending in a direction [010] of the regular octahedral oxygen precipitate when this oxygen precipitate is seen from a direction [100]) was 70 nm. This silicon wafer was put into a transverse furnace having a nitrogen atmosphere at 1000° C. in an upright state at an input speed of 15 cm/minute, held in this furnace for 30 minutes and taken out from the furnace at a take-out speed of 15 cm/minute. At this time, a maximum heat stress S acting in a tangent line direction of a silicon wafer outer peripheral portion, which was obtained by measuring a temperature in a wafer plane during the actual heat treatment and performing a calculation based on said measured value, was 70 MPa. This silicon wafer is referred to as Example 17.

Example 18

First, there was prepared a p-type silicon single crystal having a diameter of 150 mm and an oxygen concentration of $15.5 \times 10^{17}$ atoms/cm$^3$. Subsequently, this silicon single crystal was sliced to produce a silicon wafer, an oxygen ions were implanted into the silicon wafer, and then a high-temperature heat treatment was performed to form a buried oxide layer, thereby manufacturing an SIMOX wafer. A heat treatment where this wafer is held in a nitrogen atmosphere at 700° C. for one hour to form oxygen precipitate nuclei was carried out. Here, in a process of increasing a temperature to 700° C., this process was effected at a temperature-up speed of 1.2° C./minute in the range from 550 to 700° C. Furthermore, a heat treatment where the wafer is held in a diluted oxygen atmosphere (a mixed gas atmosphere with oxygen and nitrogen mixed in the ration of 3% to 100%) at 1000° C. for one hour to grow oxygen precipitate nuclei was performed. As a result, the oxygen precipitate nuclei grew into square tabular oxygen precipitates. A density D of the square tabular oxygen precipitates in this wafer was $2 \times 10^9$ pieces/cm$^3$. Moreover, a size L of this square tabular oxygen precipitate (a diagonal length extending in a direction [010] of the square tabular oxygen precipitate when this oxygen precipitate is seen from a direction [100]) was 60 nm. This wafer was put into a transverse furnace having a nitrogen atmosphere at 1000° C. in an upright state at an input speed of 15 cm/minute, held in this furnace for 30 minutes, and then taken out from the furnace at a take-out speed of 15 cm/minute. At this time, a maximum heat stress S acting in a tangent line direction of a silicon wafer outer peripheral portion, which was obtained by measuring a temperature in a wafer plane during the actual heat treatment and performing a calculation based on said measured value, was 70 MPa. This silicon wafer is referred to as Example 18.

Example 19

First, there was prepared a p-type silicon single crystal having a diameter of 150 mm and an oxygen concentration of $15.5 \times 10^{17}$ atoms/cm$^3$. Subsequently, this silicon single crystal was sliced to produce a silicon wafer, an oxygen ions were implanted into the silicon wafer, and then a high-temperature heat treatment was performed to form a buried oxide layer, thereby manufacturing an SIMOX wafer. A heat treatment where this wafer is held in a nitrogen atmosphere at 700° C. for one hour to form oxygen precipitate nuclei was carried out. Here, in the process of increasing a temperature to 700° C., a process in the range from 550 to 700° C. was effected at a temperature-up speed of 1.2° C./minute. Furthermore, a heat treatment where is held the wafer in a diluted oxygen atmosphere (a mixed gas atmosphere with oxygen and nitrogen mixed in the ration of 3% to 100%) at 1000° C. for four hours to grow oxygen precipitate nuclei was performed. As a result, the oxygen precipitate nuclei grew into square tabular oxygen precipitates. A density D of the square tabular oxygen precipitates in this wafer was $2 \times 10^9$ pieces/cm$^3$. Moreover, a size L of this square tabular oxygen precipitate (a diagonal length extending in a direction [010] of the square tabular oxygen precipitate when this oxygen precipitate is seen from a direction [100]) was 150 nm. This wafer was put into a transverse furnace having a nitrogen atmosphere at 1000° C. in an upright state at an input speed of 7 cm/minute, held in this furnace for 30 minutes, and then taken out from the furnace at a take-out speed of 7 cm/minute. At this time, a maximum heat stress S acting in a tangent line direction of a silicon wafer outer peripheral portion was obtained by measuring a temperature in a wafer plane during the actual heat treatment and performing a calculation based on this measured value, and this maximum heat stress S was 35 MPa. This silicon wafer is referred to as Example 19.

Example 20

First, there was prepared a p-type silicon single crystal having a diameter of 150 mm and an oxygen concentration of $15.5 \times 10^{17}$ atoms/cm$^3$. Subsequently, this silicon single crystal was sliced to produce a silicon wafer, an oxygen ions were implanted into the silicon wafer, and then a high-temperature heat treatment was performed to form a buried oxide layer, thereby manufacturing an SIMOX wafer. A heat treatment where this wafer is held in a nitrogen atmosphere at 700° C. for one hour to form oxygen precipitate nuclei was carried out. Here, in a process of increasing a temperature to 700° C., this process was effected at a temperature-up speed of 1.2° C./minute in the range from 550 to 700° C. Furthermore, a heat treatment where the wafer is held in a diluted oxygen atmosphere (a mixed gas atmosphere with oxygen and nitrogen mixed in the ration of 3% to 100%) at 1000° C. for 20 hours to grow oxygen precipitate nuclei was performed. As a result, the oxygen precipitate nuclei grew into square tabular oxygen precipitates. A density D of the square tabular oxygen precipitates in this wafer was $2 \times 10^9$ pieces/cm$^3$. Moreover, a size L of this square tabular oxygen precipitate (a diagonal length extending in a direction [010] of the square tabular oxygen precipitate when this oxygen precipitate is seen from a direction [100]) was 450 nm. This wafer was put into a transverse furnace having a nitrogen atmosphere at 1000° C. in an upright state at an input speed of 3 cm/minute, held in this furnace for 30 minutes, and then taken out from the furnace at a take-out speed of 3 cm/minute. At this time, a maximum heat stress S acting in a tangent line direction of a silicon wafer outer peripheral portion was obtained by measuring a temperature in a wafer plane during the actual heat treatment and performing a calculation based on this measured value, and this maximum heat stress S was 20 MPa. This silicon wafer is referred to as Example 20.

Comparative Example 6

A heat treatment was applied to a silicon wafer like Example 15 except that a heat treatment where the silicon wafer is held in a nitrogen atmosphere at 1100° C. for four hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 330 nm, and a maximum heat stress S acting in a tangent line direction of a silicon wafer outer peripheral portion was 35 MPa. This silicon wafer is referred to as Comparative Example 6.

Comparative Example 7

A heat treatment was applied to a silicon wafer like Example 15 except that a heat treatment where the silicon wafer is held in a nitrogen atmosphere at 1100° C. for eight hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 400 nm, and a maximum heat stress S acting in a tangent line direction of a silicon wafer outer peripheral portion was 35 MPa. This silicon wafer is referred to as Comparative Example 7.

Comparative Example 8

A heat treatment was applied to a silicon wafer like Example 15 except that a heat treatment where the silicon wafer is held in a nitrogen atmosphere at 1100° C. for 16 hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 490 nm, and a maximum heat stress S acting in a tangent line direction of a silicon wafer outer peripheral portion was 35 MPa. This silicon wafer is referred to as Comparative Example 8.

Comparative Example 9

A heat treatment was applied to a silicon wafer like Example 17 except that a heat treatment where the silicon wafer is held in a nitrogen atmosphere at 1100° C. for 0.23 hour was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 200 nm, and a maximum heat stress S acting in a tangent line direction of a silicon wafer outer peripheral portion was 70 MPa. This silicon wafer is referred to as Comparative Example 9.

Comparative Example 10

A heat treatment was applied to a silicon wafer like Example 17 except that a heat treatment where the silicon wafer is held in a nitrogen atmosphere at 1100° C. for four hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 330 nm, and a maximum heat stress S acting in a tangent line direction of a silicon wafer outer peripheral portion was 70 MPa. This silicon wafer is referred to as Comparative Example 10.

Comparative Example 11

A heat treatment was applied to a silicon wafer like Example 17 except that a heat treatment where the silicon wafer is held in a nitrogen atmosphere at 1100° C. for eight hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 400 nm, and a maximum heat stress S acting in a tangent line direction of a silicon wafer outer peripheral portion was 70 MPa. This silicon wafer is referred to as Comparative Example 11.

Comparative Example 12

A heat treatment was applied to a silicon wafer like Example 17 except that a heat treatment where the silicon wafer is held in a nitrogen atmosphere at 1100° C. for 16 hours was performed. A density D of regular octahedral oxygen precipitates in this silicon wafer was $2 \times 10^9$ pieces/cm$^3$, a size L of the oxygen precipitate (a diagonal length extending in a direction [010] of the regular octahedral oxygen precipitate when this oxygen precipitate is seen from a direction [100]) was 490 nm, and a maximum heat stress S acting in a tangent line direction of a silicon wafer outer peripheral portion was 70 MPa. This silicon wafer is referred to as Comparative Example 12.

Comparative Example 13

First, there was prepared a p-type silicon single crystal having a diameter of 150 mm and an oxygen concentration of $15.5 \times 10^{17}$ atoms/cm$^3$. Subsequently, this silicon single crystal was sliced to produce a silicon wafer, an oxygen ions were implanted into the silicon wafer, and then a high-temperature heat treatment was performed to form a buried oxide layer, thereby manufacturing an SIMOX wafer. A heat treatment where this wafer is held in a nitrogen atmosphere at 700° C. for one hour to form oxygen precipitate nuclei was effected. Here, in a process of increasing a temperature to 700° C., this process was carried out at a temperature-up speed of 1.2° C./minute in the range of 550 to 700° C. Moreover, a heat treatment where the wafer is held in a diluted oxygen atmosphere (a mixed gas atmosphere with oxygen and nitrogen mixed in the ration of 3% to 100%) at 1000° C. for four hours to grow the oxygen precipitate nuclei was performed. As a result, the oxygen precipitate nuclei grew into square tabular oxygen precipitates. A density D of the square tabular oxygen precipitates in this wafer was $2 \times 10^9$ pieces/cm$^3$. Additionally, a size L of this square tabular oxygen precipitate (a diagonal length extending in a direction of the square tabular oxygen precipitate when this oxygen precipitate is seen from a direction [100]) was 150 nm. This wafer was put into a transverse furnace having a nitrogen atmosphere at 1000° C. in an upright state at an input speed of 15 cm/minute, held in this furnace for 30 minutes, and then taken out from the furnace at a take-out speed of 15 cm/minutes. At this time, a maximum heat stress S acting in a tangent line direction of a silicon wafer outer peripheral portion was obtained by measuring a temperature in a wafer plane during the actual heat treatment and performing a calculation based on this measured value, and the maximum heat stress S was 70 MPa. This silicon wafer is referred to as Comparative Example 13.

Comparative Example 14

First, there was prepared a p-type silicon single crystal having a diameter of 150 mm and an oxygen concentration of $15.5 \times 10^{17}$ atoms/cm$^3$. Subsequently, this silicon single crystal was sliced to produce a silicon wafer, an oxygen ions were implanted into the silicon wafer, and then a high-temperature heat treatment was performed to form a buried oxide layer, thereby manufacturing an SIMOX wafer. A heat treatment where this wafer is held in a nitrogen atmosphere at 700° C. for one hour to form oxygen precipitate nuclei was effected. Here, in a process of increasing a temperature to 700° C., this process was carried out at a temperature-up speed of 1.2° C./minute in the range of 550 to 700° C. Moreover, a heat treatment where the wafer is held in a diluted oxygen atmosphere (a mixed gas atmosphere with oxygen and nitrogen mixed in the ration of 3% to 100%) at 1000° C. for eight hours to grow the oxygen precipitate nuclei was performed. As a result, the oxygen precipitate nuclei grew into square tabular oxygen precipitates. A density D of the square tabular oxygen precipitates in this wafer was $2\times10^9$ pieces/cm$^3$. Additionally, a size L of this square tabular oxygen precipitate (a diagonal length extending in a direction of the square tabular oxygen precipitate when this oxygen precipitate is seen from a direction [100]) was 250 nm. This wafer was put into a transverse furnace having a nitrogen atmosphere at 1000° C. in an upright state at an input speed of 7 cm/minute, held in this furnace for 30 minutes, and then taken out from the furnace at a take-out speed of 7 cm/minutes. At this time, a maximum heat stress S acting in a tangent line direction of a silicon wafer outer peripheral portion was obtained by measuring a temperature in a wafer plane during the actual heat treatment and performing a calculation based on this measured value, and the maximum heat stress S was 35 MPa. This silicon wafer is referred to as Comparative Example 14.

<Comparative Test 2 and Evaluation>

Figure 7:
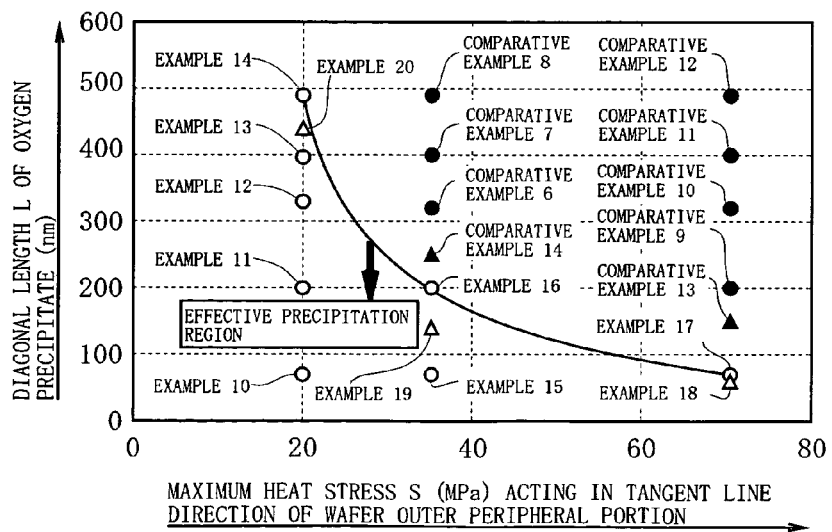
FIG. 7 is a view showing changes in the diagonal lengths L of the regular octahedral oxygen precipitate and the tabular square oxygen precipitate in relation to changes in a maximum heat stress S acting in a tangent line direction of an outer peripheral portion of this wafer.

Each of the silicon wafers according to Examples 10 to 20 and Comparative Examples 6 to 14 set upright on a wafer board was put into a transverse furnace heated to 1000° C. in a nitrogen atmosphere at a varied input speed, i.e. 3 cm/minute, 7 cm/minute or 15 cm/minute. Further, each silicon wafer was held in the furnace for 30 minutes to perform a heat treatment, and then the wafer was taken out from the furnace at the same speed as the input speed. A maximum heat stress acting in a tangent line direction of each wafer outer peripheral portion was varied to 20 MPa, 35 MPa or 70 MPa by changing the input speed and the take-out speed. After this heat treatment, a slip occurrence behavior from an edge of each silicon wafer was evaluated by using XRT (X-Ray Topograph). Table 2 and FIG. 7 show its result. It is to be noted that Table 2 shows an oxygen concentration, a heat treatment time at 1000° C. of the wafer, a heat treatment time at 1100° C. of the wafer, an input speed and a take-out speed of the wafer into/from the transverse furnace, and a maximum heat stress acting in the tangent line direction of each wafer outer peripheral portion. Furthermore, in FIG. 7, each of a white circle and a black circuit represents an example of a regular octahedral oxygen precipitate and each of a white triangle and a black triangle represents an example of a square tabular precipitate. Moreover, the white circle and the white triangle mean that no slip was generated, and the black circle and the black triangle mean that a slip was produced. Additionally, in Table 2, the heat treatment time at 1000° C. of the wafer is indicated as a first heat treatment time; the heat treatment time at 1100° C. of the wafer as a second heat treatment time; the input speed and the take-out speed of the wafer into/from the transverse furnace simply as an input and take-out speed; and the maximum heat stress acting in the tangent line direction of each wafer outer peripheral portion simply as a maximum heat stress S respectively.

TABLE 2

| | Oxygen concentration (atoms/cm$^3$) | 1st heat treatment time (hour) | 2nd heat treatment time (hour) | Input and take-out speed (cm/min) | Oxygen precipitate Shape | D (pieces/cm$^3$) | L (nm) | Maximum heat stress S (MPa) | Presence/absence of occurrence of slip |
|---|---|---|---|---|---|---|---|---|---|
| Example 10 | $14 \times 10^{17}$ | — | 0.12 | 3 | Octahedron | $2 \times 10^9$ | 70 | 20 | Absence |
| Example 11 | $14 \times 10^{17}$ | — | 0.23 | 3 | Octahedron | $2 \times 10^9$ | 200 | 20 | Absence |
| Example 12 | $14 \times 10^{17}$ | — | 4 | 3 | Octahedron | $2 \times 10^9$ | 330 | 20 | Absence |
| Example 13 | $14 \times 10^{17}$ | — | 8 | 3 | Octahedron | $2 \times 10^9$ | 400 | 20 | Absence |
| Example 14 | $14 \times 10^{17}$ | — | 16 | 3 | Octahedron | $2 \times 10^9$ | 490 | 20 | Absence |
| Example 15 | $14 \times 10^{17}$ | — | 0.12 | 7 | Octahedron | $2 \times 10^9$ | 70 | 35 | Absence |
| Example 16 | $14 \times 10^{17}$ | — | 0.23 | 7 | Octahedron | $2 \times 10^9$ | 200 | 35 | Absence |
| Example 17 | $14 \times 10^{17}$ | — | 0.12 | 15 | Octahedron | $2 \times 10^9$ | 70 | 70 | Absence |
| Example 18 | $15.5 \times 10^{17}$ | 1 | — | 15 | Square plate | $2 \times 10^9$ | 60 | 70 | Absence |
| Example 19 | $15.5 \times 10^{17}$ | 4 | — | 7 | Square plate | $2 \times 10^9$ | 150 | 35 | Absence |
| Example 20 | $15.5 \times 10^{17}$ | 20 | — | 3 | Square plate | $2 \times 10^9$ | 450 | 20 | Absence |
| Comparative Example 6 | $14 \times 10^{17}$ | — | 4 | 7 | Octahedron | $2 \times 10^9$ | 330 | 35 | Presence |
| Comparative Example 7 | $14 \times 10^{17}$ | — | 8 | 7 | Octahedron | $2 \times 10^9$ | 400 | 35 | Presence |
| Comparative Example 8 | $14 \times 10^{17}$ | — | 16 | 7 | Octahedron | $2 \times 10^9$ | 490 | 35 | Presence |
| Comparative Example 9 | $14 \times 10^{17}$ | — | 0.23 | 15 | Octahedron | $2 \times 10^9$ | 200 | 70 | Presence |
| Comparative Example 10 | $14 \times 10^{17}$ | — | 4 | 15 | Octahedron | $2 \times 10^9$ | 330 | 70 | Presence |
| Comparative Example 11 | $14 \times 10^{17}$ | — | 8 | 15 | Octahedron | $2 \times 10^9$ | 400 | 70 | Presence |
| Comparative Example 12 | $14 \times 10^{17}$ | — | 16 | 15 | Octahedron | $2 \times 10^9$ | 490 | 70 | Presence |
| Comparative example 13 | $15.5 \times 10^{17}$ | 4 | — | 15 | Square plate | $2 \times 10^9$ | 150 | 70 | Presence |
| Comparative Example 14 | $15.5 \times 10^{17}$ | 8 | — | 7 | Square plate | $2 \times 10^9$ | 250 | 35 | Presence |

As apparent from Table 2 and FIG. 7, in a case where the maximum heat stress S acting in the tangent line direction of the silicon wafer outer peripheral portion is 20 MPa, no slip was produced when the size L of the regular octahedral oxygen precipitate is 70 nm, 200 nm, 330 nm, 400 nm or 490 nm (Examples 10 to 14), and no slip was likewise generated when the size L of the square tabular oxygen precipitate is 450 nm (Example 20). Moreover, in a case where the maximum heat stress S acting in the tangent line direction of the silicon wafer outer peripheral portion is 35 MPa, no slip was produced when the size L of the regular octahedral oxygen precipitate is 70 nm or 200 nm (Examples 15 and 16), and no slip was likewise generated when the size L of the square tabular oxygen precipitate is 150 nm (Example 19), but a slip was produced when the size L of the regular octahedral oxygen precipitate is 330 nm, 400 nm or 490 nm (Comparative Examples 6 to 8), and a slip was likewise generated when the size L of the square tabular oxygen precipitate is 250 nm (Comparative Example 14). Additionally, in a case where the maximum heat stress S acting in the tangent line direction of the silicon wafer outer peripheral portion is 70 MPa, no slip was generated when the size L of the regular octahedral oxygen precipitate is 70 nm (Example 17), and no slip was produced when the size L of the square tabular oxygen precipitate is 60 nm (Example 18), but a slip was generated when the size L of the regular octahedral oxygen precipitate is 200 nm, 330 nm, 400 nm or 490 nm (Comparative Examples 9 to 12), and a slip was produced when the size L of the square tabular oxygen precipitate is 150 nm (Comparative Example 13). Based on this result, it was possible to derive the following relational expression (B) which enables to obtains a size L (nm) of an oxygen precipitate required to avoid occurrence of a slip in relation to a maximum heat stress S (MPa) acting in a tangent line direction of a silicon wafer outer peripheral portion.

$$L \leq 51000 \times S^{-1.55} \tag{B}$$

Further, based on the above explanation, it was revealed that an effect of inhibiting occurrence of a slip can be determined in dependence upon a density D and a maximum heat stress S of an oxygen precipitate irrespective of a conformation of the oxygen precipitate.

Example 21

First, there was prepared a silicon single crystal having a diameter of 200 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased was a temperature of this silicon wafer in a nitrogen gas atmosphere at a temperature-up speed of 2° C./minutes in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for 0.5 hour was performed. As a result, oxygen precipitate nuclei in the silicon wafer grew into square tabular oxygen precipitates. At this time, a density D of the oxygen precipitates was $1 \times 10^{10}$ pieces/cm$^3$. Furthermore, a size L of this square tabular oxygen precipitate (a diagonal length extending in a direction of the square tabular oxygen precipitate when this oxygen precipitate is seen from a direction [100]) was 30 nm. This silicon wafer is referred to as Example 21.

Example 22

First, there was prepared a silicon single crystal having a diameter of 200 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased was a temperature of this silicon wafer in a nitrogen gas atmosphere at a temperature-up speed of 4° C./minutes in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for one hour was performed. As a result, oxygen precipitate nuclei in the silicon wafer grew into square tabular oxygen precipitates. At this time, a density D of the oxygen precipitates was $1 \times 10^9$ pieces/cm$^3$. Furthermore, a size L of this square tabular oxygen precipitate (a diagonal length extending in a direction of the square tabular oxygen precipitate when this oxygen precipitate is seen from a direction [100]) was 50 nm. This silicon wafer is referred to as Example 22.

Example 23

First, there was prepared a silicon single crystal having a diameter of 200 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased was a temperature of this silicon wafer in a nitrogen gas atmosphere at a temperature-up speed of 8° C./minutes in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for two hours was performed. As a result, oxygen precipitate nuclei in the silicon wafer grew into square tabular oxygen precipitates. At this time, a density D of the oxygen precipitates was $1 \times 10^8$ pieces/cm$^3$. Furthermore, a size L of this square tabular oxygen precipitate (a diagonal length extending in a direction [010] of the square tabular oxygen precipitate when this oxygen precipitate is seen from a direction [100]) was 100 nm. This silicon wafer is referred to as Example 23.

Comparative Example 15

First, there was prepared a silicon single crystal having a diameter of 200 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased was a temperature of this silicon wafer in a nitrogen gas atmosphere at a temperature-up speed of 4° C./minutes in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for 0.5 hour was performed. As a result, oxygen precipitate nuclei in the silicon wafer grew into square tabular oxygen precipitates. At this time, a density D of the oxygen precipitates was $1 \times 10^9$ pieces/cm$^3$. Furthermore, a size L of this square tabular oxygen precipitate (a diagonal length extending in a direction [010] of the square tabular oxygen precipitate when this oxygen precipitate is seen from a direction [100]) was 30 nm. This silicon wafer is referred to as Comparative Example 15.

Comparative Example 16

First, there was prepared a silicon single crystal having a diameter of 200 mm, an oxygen concentration of 15×10$^{17}$ atoms/cm$^3$ and wherein carbon was doped so as to have a concentration of 1×10$^{16}$ atoms/cm$^3$. Subsequently, this silicon single crystal was sliced to produce a silicon wafer, and a heat treatment where increased is a temperature of this silicon wafer in a nitrogen gas atmosphere at a temperature-up speed of 8° C./minutes in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for 1.5 hour was performed. As a result, oxygen precipitate nuclei in the silicon wafer grew into square tabular oxygen precipitates. At this time, a density D of the oxygen precipitates was 1×10$^8$ pieces/cm$^3$. Furthermore, a size L of this square tabular oxygen precipitate (a diagonal length extending in a direction [010] of the square tabular oxygen precipitate when this oxygen precipitate is seen from a direction [100]) was 75 nm. This silicon wafer is referred to as Comparative Example 16.

<Comparative Test 3 and Evaluation>

There was performed RTA processing where increased is a temperature of each of the silicon wafers according to Examples 21 to 23 and Comparative Examples 15 and 16 to 1250° C. at a temperature-up speed of 100° C./second and then each silicon wafer is held at this temperature for 30 seconds, and a slip occurrence behavior from an edge of each silicon wafer was evaluated by using XRT (X-ray Topograph). Table 3 and FIG. 6 show its result. It is to be noted that Table 3 also shows an oxygen concentration, a carbon concentration, a temperature-up speed in the range of 700° C. to 900° C. and a time of an additional heat treatment at 1000° C. Further, in FIG. 8, each of a white square and a black square represents an example of the square tabular oxygen precipitate. The white square means that no slip was produced, and the black square means that a slip was generated. Furthermore, in Table 3, the temperature-up speed in the range of 700° C. to 900° C. is simply indicated as a temperature-up speed and the time of the additional heat treatment at 1000° C. is simply indicated as an additional heat treatment time.

1×10$^{10}$ pieces/cm$^3$, no slip was generated when the size L of the square tabular oxygen precipitate is 30 nm (Example 21). Moreover, in a case where the density D of the oxygen precipitates in the silicon wafer is 1×10$^9$ pieces/cm$^3$, no slip was generated when the size L of the square tabular oxygen precipitate is 50 nm (Example 22), but a slip was produced when the size L of the square tabular oxygen precipitate is 30 nm (Comparative Example 15). Additionally, in a case where the density D of the oxygen precipitates in the silicon wafer is 1×10$^8$ pieces/cm$^3$, no slip was produced when the size L of the square tabular oxygen precipitate is 100 nm (Example 23), but a slip was generated when the size L of the square tabular oxygen precipitate is 75 nm (Comparative Example 16). Based on this result, it was able to derive the following Relational Expression (A) which enables to obtain the size L (nm) of the oxygen precipitate which is required to avoid occurrence of a slip with respect to the density D (pieces/cm$^3$) of the oxygen precipitates.

$$L \geq 12000 \times D^{-0.26} \quad (A)$$

Further, based on the above explanation, it was revealed that the slip occurrence inhibiting effect is determined in dependence upon the density D and the size (the diagonal length) L of the oxygen precipitate irrespective of a conformation of the oxygen precipitate.

Example 24

First, there was prepared a silicon single crystal having a diameter of 150 mm, an oxygen concentration of 15×10$^{17}$ atoms/cm$^3$ and wherein carbon was doped so as to have a concentration of 1×10$^{16}$ atoms/cm$^3$. Subsequently, this silicon single crystal was sliced to produce a silicon wafer, and a heat treatment where increased is a temperature of this silicon wafer in a nitrogen atmosphere at a temperature-up speed of 3.6° C./minute in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for one hour was performed. As a result, oxygen precipitate nuclei in the silicon wafer grew into square tabular oxygen precipitates. At this time, a density D of the square tabular oxygen precipitates in the silicon wafer was 2×10$^9$ pieces/cm$^3$. Furthermore, a size L of this oxygen precipitate (a diagonal length extending

TABLE 3

| | Oxygen Concentration (atoms/cm$^3$) | Carbon concentration (atoms/cm$^3$) | Temperature-up speed (° C./min) | Additional heat treatment time (hour) | Oxygen Precipitate Shape | D (pieces/cm$^3$) | L(nm) | Presence/absence of occurrence of slip |
|---|---|---|---|---|---|---|---|---|
| Example 21 | 15 × 10$^{17}$ | 1 × 10$^{16}$ | 2 | 0.5 | Square plate | 1 × 10$^{10}$ | 30 | Absence |
| Example 22 | 15 × 10$^{17}$ | 1 × 10$^{16}$ | 4 | 1 | Square plate | 1 × 10$^9$ | 50 | Absence |
| Example 23 | 15 × 10$^{17}$ | 1 × 10$^{16}$ | 8 | 2 | Square plate | 1 × 10$^8$ | 100 | Absence |
| Comparative Example 15 | 15 × 10$^{17}$ | 1 × 10$^{16}$ | 4 | 0.5 | Square plate | 1 × 10$^9$ | 30 | Presence |
| Comparative Example 16 | 15 × 10$^{17}$ | 1 × 10$^{16}$ | 8 | 1.5 | Square plate | 1 × 10$^8$ | 75 | Presence |

Figure 8:
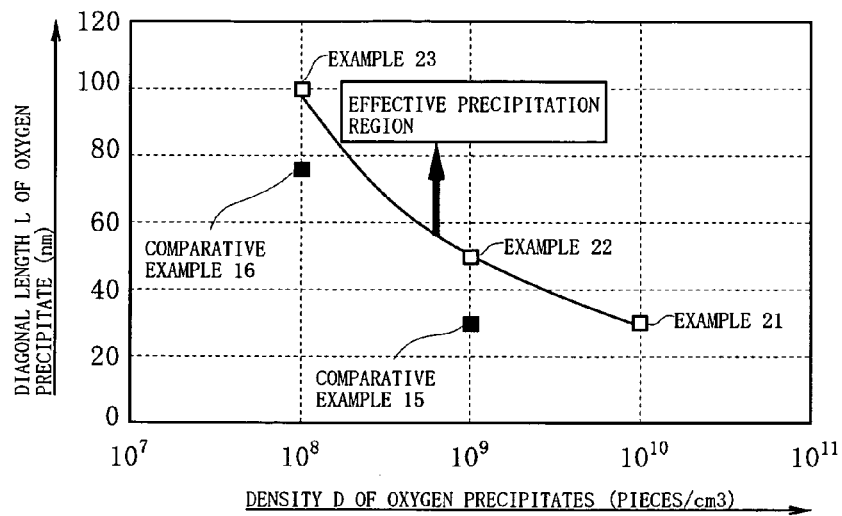
FIG. 8 is a view showing changes in the diagonal length L of the square tabular oxygen precipitate in relation to changes in the density D of the square tabular oxygen precipitate in a silicon wafer having carbon doped therein.

As apparent from Table 3 and FIG. 8, in a case where the density D of the oxygen precipitates in the silicon wafer is in a direction [010] of a regular octahedral oxygen precipitate when this oxygen precipitate is seen from a direction [100])

was 50 nm. This silicon wafer was put into a transverse furnace having a nitrogen atmosphere at 1000° C. in an upright state at an input speed of 15 cm/minute, held in this furnace for 30 minutes, and then taken out from the furnace at a take-out speed of 15 cm/minute. At this time, a maximum heat stress acting in a tangent line direction of a silicon wafer outer peripheral portion was obtained by measuring a temperature in a wafer plane during the actual heat treatment and performing a calculation based on this measured value, and the maximum heat stress S was 70 MPa. This silicon wafer is referred to as Example 24.

Example 25

First, there was prepared a silicon single crystal having a diameter of 150 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased is a temperature of this silicon wafer in a nitrogen atmosphere at a temperature-up speed of 3.6° C./minute in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for three hours was performed. As a result, oxygen precipitate nuclei in the silicon wafer grew into square tabular oxygen precipitates. At this time, a density D of the square tabular oxygen precipitates in the silicon wafer was $2 \times 10^9$ pieces/cm$^3$. Furthermore, a size L of this oxygen precipitate (a diagonal length extending in a direction [010] of a regular octahedral oxygen precipitate when this oxygen precipitate is seen from a direction [100]) was 150 nm. This silicon wafer was put into a transverse furnace having a nitrogen atmosphere at 1000° C. in an upright state at an input speed of 7 cm/minute, held in this furnace for 30 minutes, and then taken out from the furnace at a take-out speed of 7 cm/minute. At this time, a maximum heat stress acting in a tangent line direction of a silicon wafer outer peripheral portion was obtained by measuring a temperature in a wafer plane during the actual heat treatment and performing a calculation based on this measured value, and the maximum heat stress S was 35 MPa. This silicon wafer is referred to as Example 25.

Example 26

First, there was prepared a silicon single crystal having a diameter of 150 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased is a temperature of this silicon wafer in a nitrogen atmosphere at a temperature-up speed of 3.6° C./minute in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for 12 hours was performed. As a result, oxygen precipitate nuclei in the silicon wafer grew into square tabular oxygen precipitates. At this time, a density D of the square tabular oxygen precipitates in the silicon wafer was $2 \times 10^9$ pieces/cm$^3$. Furthermore, a size L of this oxygen precipitate (a diagonal length extending in a direction [010] of a regular octahedral oxygen precipitate when this oxygen precipitate is seen from a direction [100]) was 480 nm. This silicon wafer was put into a transverse furnace having a nitrogen atmosphere at 1000° C. in an upright state at an input speed of 3 cm/minute, held in this furnace for 30 minutes, and then taken out from the furnace at a take-out speed of 3 cm/minute. At this time, a maximum heat stress acting in a tangent line direction of a silicon wafer outer peripheral portion was obtained by measuring a temperature in a wafer plane during the actual heat treatment and performing a calculation based on this measured value, and the maximum heat stress S was 20 MPa. This silicon wafer is referred to as Example 26.

Comparative Example 17

First, there was prepared a silicon single crystal having a diameter of 150 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased is a temperature of this silicon wafer in a nitrogen atmosphere at a temperature-up speed of 3.6° C./minute in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for three hours was performed. As a result, oxygen precipitate nuclei in the silicon wafer grew into square tabular oxygen precipitates. At this time, a density D of the square tabular oxygen precipitates in the silicon wafer was $2 \times 10^9$ pieces/cm$^3$. Furthermore, a size L of this oxygen precipitate (a diagonal length extending in a direction [010] of a regular octahedral oxygen precipitate when this oxygen precipitate is seen from a direction [100]) was 150 nm. This silicon wafer was put into a transverse furnace having a nitrogen atmosphere at 1000° C. in an upright state at an input speed of 15 cm/minute, held in this furnace for 30 minutes, and then taken out from the furnace at a take-out speed of 15 cm/minute. At this time, a maximum heat stress acting in a tangent line direction of a silicon wafer outer peripheral portion was obtained by measuring a temperature in a wafer plane during the actual heat treatment and performing a calculation based on this measured value, and the maximum heat stress S was 70 MPa. This silicon wafer is referred to as Comparative Example 17.

Comparative Example 18

First, there was prepared a silicon single crystal having a diameter of 150 mm, an oxygen concentration of $15 \times 10^{17}$ atoms/cm$^3$ and wherein carbon was doped so as to have a concentration of $1 \times 10^{16}$ atoms/cm$^3$. Subsequently, this silicon single crystal was sliced to produce a silicon wafer, and a heat treatment where increased is a temperature of this silicon wafer in a nitrogen atmosphere at a temperature-up speed of 3.6° C./minute in the range of 700° C. to 900° C. was carried out. Then, an epitaxial film having a thickness of 4 μm was grown on the silicon wafer, and an additional heat treatment where the silicon wafer is held in a diluted oxygen atmosphere (a mixed gas atmosphere with oxygen and nitrogen mixed in the ration of 3% to 100%) at 1000° C. for six hours was performed. As a result, oxygen precipitate nuclei in the silicon wafer grew into square tabular oxygen precipitates. At this time, a density D of the square tabular oxygen precipitates in the silicon wafer was $2\times10^9$ pieces/cm$^3$. Furthermore, a size L of this oxygen precipitate (a diagonal length extending in a direction [010] of a regular octahedral oxygen precipitate when this oxygen precipitate is seen from a direction [100]) was 250 nm. This silicon wafer was put into a transverse furnace having a nitrogen atmosphere at 1000° C. in an upright state at an input speed of 7 cm/minute, held in this furnace for 30 minutes, and then taken out from the furnace at a take-out speed of 7 cm/minute. At this time, a maximum heat stress acting in a tangent line direction of a silicon wafer outer peripheral portion was obtained by measuring a temperature in a wafer plane during the actual heat treatment and performing a calculation based on this measured value, and the maximum heat stress S was 35 MPa. This silicon wafer is referred to as Comparative Example 18.

<Comparative Test 4 and Evaluation>

Figure 9:
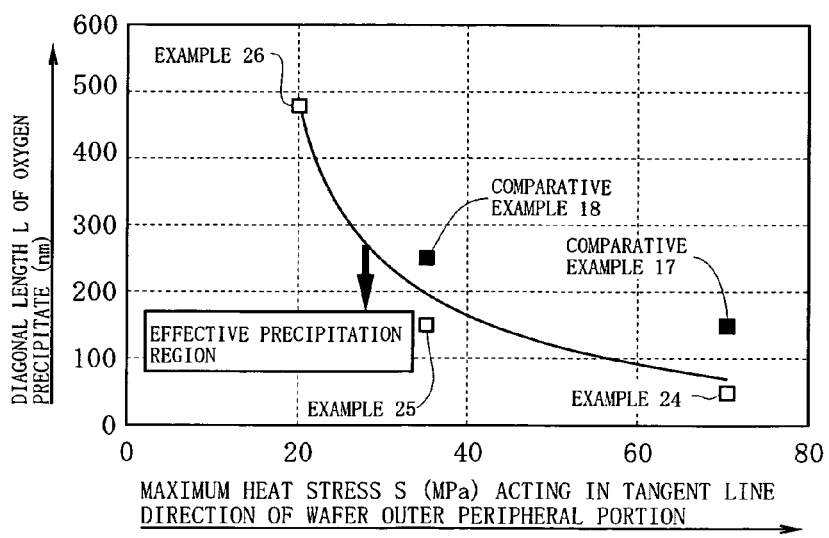
FIG. 9 is a view showing changes in the diagonal length L of the tabular square oxygen precipitate in relation to changes in the maximum heat stress S acting in the tangent line direction of the outer peripheral portion of this wafer.

Each of the silicon wafers according to Examples 24 to 26 and Comparative Examples 17 and 18 set upright on a wafer board was put into a transverse furnace heated to 1000° C. in a nitrogen atmosphere at a varied input speed, i.e. 15 cm/minute, 7 cm/minute or 3 cm/minute. Further, each silicon wafer was held in the furnace for 30 minutes to perform a heat treatment, and then the wafer was taken out from the furnace at the same speed as the input speed. A maximum heat stress acting in a tangent line direction of each wafer outer peripheral portion was varied to 70 MPa, 35 MPa or 20 MPa by changing the input speed and the take-out speed. After this heat treatment, a slip occurrence behavior from an edge of each silicon wafer was evaluated by using XRT (X-Ray Topograph). Table 4 and FIG. 9 show its result. It is to be noted that Table 4 shows an oxygen concentration, a heat treatment time at 1000° C. of the wafer, an input speed and a take-out speed of the wafer into/from the transverse furnace, and a maximum heat stress acting in the tangent line direction of each wafer outer peripheral portion. Furthermore, in FIG. 9, each of a white square and a black square represents an example of a regular octahedral oxygen precipitate. Moreover, the white square means that no slip was generated, and the black square means that a slip was produced. Additionally, in Table 4, the additional heat treatment at 1000° C. time of the wafer is simply determined as an additional heat treatment time; the input speed and the take-out speed of the wafer into/from the transverse furnace, simply an input and take-out speed; and the maximum heat stress acting in the tangent line direction of each wafer outer peripheral portion, simply a maximum heat stress S.

As apparent from Table 4 and FIG. 9, in a case where the maximum heat stress S acting in the tangent line direction of the silicon wafer outer peripheral portion is 70 MPa, no slip was generated when the size L of the square tabular oxygen precipitate is 50 nm (Example 24), but a slip was produced when the size L of the square tabular oxygen precipitate is 150 nm (Comparative Example 17). Further, in a case where the maximum heat stress S acting in the tangent line direction of the silicon wafer outer peripheral portion is 35 MPa, no slip was generated when the size L of the square tabular oxygen precipitate is 150 nm (Example 25), but a slip was produced when the size L of the square tabular oxygen precipitate is 250 nm (Comparative Example 18). Furthermore, in a case where the maximum heat stress S acting in the tangent line direction of the silicon wafer outer peripheral portion is 20 MPa, no slip was generated when the size L of the square tabular oxygen precipitate is 480 nm (Example 26). Based on this result, it was possible to derive the following Relational Expression (B) calculating the size L (nm) of the oxygen precipitate required to avoid occurrence of a slip with respect to the maximum heat stress S (MPa) acting in the tangent line direction of the silicon wafer outer peripheral portion.

$$L \leq 51000 \times S^{-1.55} \tag{B}$$

Moreover, based on the above explanation, it was revealed that the slip occurrence inhibition effect is determined in dependence upon the density D and the maximum heat stress S of the oxygen precipitate irrespective of a conformation of the oxygen precipitate.

INDUSTRIAL APPLICABILITY

Manufacturing a silicon wafer according to the method of the present invention, i.e., forming oxygen precipitates having a predetermined density and size in a silicon wafer can obtain a silicon wafer in which no slip is generated and which has high strength in a wide density range of the oxygen precipitates, and the present invention can be also applied to a silicon wafer having a large diameter.

The invention claimed is:

1. A method for manufacturing a silicon wafer, produced by slicing a silicon single-crystal rod to obtain a silicon wafer, subjecting the silicon wafer to a first heat treatment to form oxygen precipitate nuclei therein, and then subjecting the silicon wafer to a second heat treatment which grows the oxygen precipitate nuclei to form oxygen precipitates therein, and further then subjecting the silicon wafer having the oxy-

TABLE 4

| | Oxygen Concentration (atoms/cm$^3$) | Carbon concentration (atoms/cm$^3$) | Additional heat treatment time (hour) | Input and take-out time (cm/min) | Oxygen precipitate | | | Maximum heat stress S (MPa) | Presence/absence of occurrence of slip |
|---|---|---|---|---|---|---|---|---|---|
| | | | | | Shape | D (pieces/cm$^3$) | L (nm) | | |
| Example 24 | $15 \times 10^{17}$ | $1 \times 10^{16}$ | 1 | 15 | Square plate | $2 \times 10^9$ | 50 | 70 | Absence |
| Example 25 | $15 \times 10^{17}$ | $1 \times 10^{16}$ | 3 | 7 | Square plate | $2 \times 10^9$ | 150 | 35 | Absence |
| Example 26 | $15 \times 10^{17}$ | $1 \times 10^{16}$ | 12 | 3 | Square plate | $2 \times 10^9$ | 480 | 20 | Absence |
| Comparative Example 17 | $15 \times 10^{17}$ | $1 \times 10^{16}$ | 3 | 15 | Square plate | $2 \times 10^9$ | 150 | 70 | Presence |
| Comparative example 18 | $15 \times 10^{17}$ | $1 \times 10^{16}$ | 6 | 7 | Square plate | $2 \times 10^9$ | 250 | 35 | Presence | gen precipitates formed therein to a third heat treatment in a semiconductor device manufacturing process, the method for manufacturing the silicon wafer comprising:

setting a plurality of types of oxygen concentrations within the range of $10\times10^{17}$ to $18\times10^{17}$ atoms/cm$^3$ (ASTM F-121, 1979) and thermal histories for manufacture of the wafer;

calculating each of a diagonal length L (nm) and a density D (pieces/cm$^3$) of the oxygen precipitates in the silicon wafer after the second heat treatment step to form the oxygen precipitates and immediately before the third heat treatment step of the device manufacturing process by solving a Fokker-Planck equation using respective combinations of the plurality of types of oxygen concentrations and thermal histories as input parameters;

calculating a maximum heat stress S (MPa) acting in a tangent line direction of an outer peripheral portion of the silicon wafer in the third heat treatment step of the device manufacturing process based on a structure and a third heat treatment temperature of a third heat treatment furnace used in the third heat treatment step of the device manufacturing process; and determining an oxygen concentration and a thermal history satisfying the following expression (1) in the plurality of types of oxygen concentrations and thermal histories:

$$12000\times D^{-0.26} \leq L \leq 51000\times S^{-1.55} \qquad (1).$$

2. The method of claim 1, further comprising setting a plurality of concentrations of a dopant selected from a group consisting of B, P, As and Sb in the silicon wafer within the range of $1\times10^{12}$ to $1\times10^{21}$ atoms/cm$^3$, and adding these dopant concentrations to the input parameters.

3. The method of claim 1, further comprising setting a plurality of carbon concentrations in the silicon wafer within the range of $1\times10^{15}$ to $1\times10^{18}$ atoms/cm$^3$, and adding these carbon concentrations to the input parameters.

4. The method of claim 2 further comprising setting a plurality of carbon concentrations in the silicon wafer within the range of $1\times10^{15}$ to $1\times10^{18}$ atoms/cm$^3$, and adding these carbon concentrations to the input parameters.

5. The method of claim 1, further comprising setting a plurality of nitrogen concentrations in the silicon wafer within the range of $1\times10^{12}$ to $1\times10^{17}$ atoms/cm$^3$, and adding these nitrogen concentrations to the input parameters.

6. The method of claim 2, further comprising setting a plurality of nitrogen concentrations in the silicon wafer within the range of $1\times10^{12}$ to $1\times10^{17}$ atoms/cm$^3$, and adding these nitrogen concentrations to the input parameters.

7. The method of claim 3 further comprising setting a plurality of nitrogen concentrations in the silicon wafer within the range of $1\times10^{12}$ to $1\times10^{17}$ atoms/cm$^3$, and adding these nitrogen concentrations to the input parameters.

8. The method of claim 4, further comprising setting a plurality of nitrogen concentrations in the silicon wafer within the range of $1\times10^{15}$ to $1\times10^{18}$ atoms/cm$^3$, and adding these nitrogen concentrations to the input parameters.

* * * * *

UNITED STATES PATENT AND TRADEMARK OFFICE
CERTIFICATE OF CORRECTION

PATENT NO. : 7,700,394 B2
APPLICATION NO. : 11/631451
DATED : April 20, 2010
INVENTOR(S) : Shinsuke Sadamitsu et al.

It is certified that error appears in the above-identified patent and that said Letters Patent is hereby corrected as shown below:

On the Title page of the printed patent, at Item (54), Title, "METHOD FOR MANUFACTURING SILICON WAFER METHOD" should be --METHOD FOR MANUFACTURING SILICON WAFER--.

Signed and Sealed this

Tenth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,700,394 B2 Page 1 of 1
APPLICATION NO. : 11/631451
DATED : April 20, 2010
INVENTOR(S) : Shinsuke Sadamitsu et al.

It is certified that error appears in the above-identified patent and that said Letters Patent is hereby corrected as shown below:

On the Title page of the printed patent, at Item (54) and at Column 1, lines 1 and 2, Title, "METHOD FOR MANUFACTURING SILICON WAFER METHOD" should be --METHOD FOR MANUFACTURING SILICON WAFER--.

This certificate supersedes the Certificate of Correction issued August 10, 2010.

Signed and Sealed this

Thirty-first Day of August, 2010

David J. Kappos
*Director of the United States Patent and Trademark Office*